(12) United States Patent
Paulson et al.

(10) Patent No.: US 12,063,274 B2
(45) Date of Patent: Aug. 13, 2024

(54) SELF-CONFIGURING BUILDING MANAGEMENT SYSTEM

(71) Applicant: Tyco Fire & Security GmbH, Neuhausen am Rheinfall (CH)

(72) Inventors: Erik S. Paulson, Madison, WI (US); Ambuj Shatdal, Milwaukee, WI (US); ZhongYi Jin, Santa Clara, CA (US); Chenlu Zhang, Milwaukee, WI (US); Youngchoon Park, Brookfield, WI (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 0 days.

(21) Appl. No.: 17/170,615

(22) Filed: Feb. 8, 2021

(65) Prior Publication Data

US 2022/0137569 A1 May 5, 2022

Related U.S. Application Data

(60) Provisional application No. 63/108,137, filed on Oct. 30, 2020.

(51) Int. Cl.
*H04L 67/12* (2022.01)
*G05B 15/02* (2006.01)
(Continued)

(52) U.S. Cl.
CPC ............. *H04L 67/12* (2013.01); *G05B 15/02* (2013.01); *G05B 17/02* (2013.01);
(Continued)

(58) Field of Classification Search
CPC ... G05B 15/02; G06F 16/9024; G06F 16/285; G06F 16/951; G06F 16/24578
(Continued)

(56) References Cited

U.S. PATENT DOCUMENTS 5,301,109 A  4/1994 Landauer et al.
5,446,677 A  8/1995 Jensen et al.
(Continued)

FOREIGN PATENT DOCUMENTS

AU  2019226217 A1  11/2020
AU  2019226264 A1  11/2020
(Continued)

OTHER PUBLICATIONS

U.S. Appl. No. 16/885,959 filed May 28, 2020, Johnson Controls Technology Co.
(Continued)

*Primary Examiner* — Hosain T Alam
*Assistant Examiner* — Nicholas E Allen
(74) *Attorney, Agent, or Firm* — Foley & Lardner LLP

(57) ABSTRACT

A method for generating a graph data structure comprises receiving, by one or more processors, data associated with a building, generating one or more space nodes in the graph data structure corresponding to spaces within the building based on the data, generating one or more asset nodes in the graph data structure corresponding to assets within the building based on the data, associating sensor data with the one or more asset nodes based on the data, classifying the sensor data based on the data, and generating a relationship between at least two of the one or more space nodes, the one or more asset nodes, and the classified sensor data.

20 Claims, 12 Drawing Sheets

(51) Int. Cl.

| | | |
|---|---|---|
| *G05B 17/02* | (2006.01) | |
| *G06F 3/04815* | (2022.01) | |
| *G06F 16/21* | (2019.01) | |
| *G06F 16/28* | (2019.01) | |
| *G06F 16/901* | (2019.01) | |
| *G06F 16/9038* | (2019.01) | |
| *G06F 18/213* | (2023.01) | |
| *G06F 18/214* | (2023.01) | |
| *G06F 18/23* | (2023.01) | |
| *G06F 30/13* | (2020.01) | |
| *G06N 3/08* | (2023.01) | |
| *G06N 20/00* | (2019.01) | |
| *G16Y 30/00* | (2020.01) | |
| *G16Y 40/20* | (2020.01) | |
| *G16Y 40/35* | (2020.01) | |

(52) U.S. Cl.
CPC ........ *G06F 3/04815* (2013.01); *G06F 16/219* (2019.01); *G06F 16/285* (2019.01); *G06F 16/9024* (2019.01); *G06F 16/9038* (2019.01); *G06F 18/213* (2023.01); *G06F 18/214* (2023.01); *G06F 18/23* (2023.01); *G06F 30/13* (2020.01); *G06N 3/08* (2013.01); *G06N 20/00* (2019.01); *G16Y 30/00* (2020.01); *G16Y 40/20* (2020.01); *G16Y 40/35* (2020.01)

(58) Field of Classification Search
USPC ....................................................... 707/737
See application file for complete search history.

(56) References Cited

U.S. PATENT DOCUMENTS

| | | | |
|---|---|---|---|
| 5,581,478 | A | 12/1996 | Cruse et al. |
| 5,812,962 | A | 9/1998 | Kovac |
| 5,960,381 | A | 9/1999 | Singers et al. |
| 5,973,662 | A | 10/1999 | Singers et al. |
| 6,014,612 | A | 1/2000 | Larson et al. |
| 6,031,547 | A | 2/2000 | Kennedy |
| 6,134,511 | A | 10/2000 | Subbarao |
| 6,157,943 | A | 12/2000 | Meyer |
| 6,285,966 | B1 | 9/2001 | Brown et al. |
| 6,363,422 | B1 | 3/2002 | Hunter et al. |
| 6,385,510 | B1 | 5/2002 | Hoog et al. |
| 6,389,331 | B1 | 5/2002 | Jensen et al. |
| 6,401,027 | B1 | 6/2002 | Xu et al. |
| 6,437,691 | B1 | 8/2002 | Sandelman et al. |
| 6,477,518 | B1 | 11/2002 | Li et al. |
| 6,487,457 | B1 | 11/2002 | Hull et al. |
| 6,493,755 | B1 | 12/2002 | Hansen et al. |
| 6,577,323 | B1 | 6/2003 | Jamieson et al. |
| 6,626,366 | B2 | 9/2003 | Kayahara et al. |
| 6,646,660 | B1 | 11/2003 | Patty |
| 6,704,016 | B1 | 3/2004 | Oliver et al. |
| 6,732,540 | B2 | 5/2004 | Sugihara et al. |
| 6,764,019 | B1 | 7/2004 | Kayahara et al. |
| 6,782,385 | B2 | 8/2004 | Natsumeda et al. |
| 6,813,532 | B2 | 11/2004 | Eryurek et al. |
| 6,816,811 | B2 | 11/2004 | Seem |
| 6,823,680 | B2 | 11/2004 | Jayanth |
| 6,826,454 | B2 | 11/2004 | Sulfstede |
| 6,865,511 | B2 | 3/2005 | Frerichs et al. |
| 6,925,338 | B2 | 8/2005 | Eryurek et al. |
| 6,986,138 | B1 | 1/2006 | Sakaguchi et al. |
| 7,031,880 | B1 | 4/2006 | Seem et al. |
| 7,243,054 | B2 | 7/2007 | Rappaport et al. |
| 7,401,057 | B2 | 7/2008 | Eder |
| 7,552,467 | B2 | 6/2009 | Lindsay |
| 7,627,544 | B2 | 12/2009 | Chkodrov et al. |
| 7,818,249 | B2 | 10/2010 | Lovejoy et al. |
| 7,889,051 | B1 | 2/2011 | Billig et al. |
| 7,996,488 | B1 | 8/2011 | Casabella et al. |
| 8,078,330 | B2 | 12/2011 | Brickfield et al. |
| 8,104,044 | B1 | 1/2012 | Scofield et al. |
| 8,145,995 | B2 | 3/2012 | Rohrabaugh et al. |
| 8,229,470 | B1 | 7/2012 | Ranjan et al. |
| 8,401,991 | B2 | 3/2013 | Wu et al. |
| 8,495,745 | B1 | 7/2013 | Schrecker et al. |
| 8,516,016 | B2 | 8/2013 | Park et al. |
| 8,525,828 | B1 | 9/2013 | Bates |
| 8,532,808 | B2 | 9/2013 | Drees et al. |
| 8,532,839 | B2 | 9/2013 | Drees et al. |
| 8,600,556 | B2 | 12/2013 | Nesler et al. |
| 8,635,182 | B2 | 1/2014 | Mackay |
| 8,682,921 | B2 | 3/2014 | Park et al. |
| 8,731,724 | B2 | 5/2014 | Drees et al. |
| 8,737,334 | B2 | 5/2014 | Ahn et al. |
| 8,738,334 | B2 | 5/2014 | Jiang et al. |
| 8,751,487 | B2 | 6/2014 | Byrne et al. |
| 8,788,097 | B2 | 7/2014 | Drees et al. |
| 8,805,995 | B1 | 8/2014 | Oliver |
| 8,843,238 | B2 | 9/2014 | Wenzel et al. |
| 8,874,071 | B2 | 10/2014 | Sherman et al. |
| 8,941,465 | B2 | 1/2015 | Pineau et al. |
| 8,990,127 | B2 | 3/2015 | Taylor |
| 9,070,113 | B2 | 6/2015 | Shafiee et al. |
| 9,116,978 | B2 | 8/2015 | Park et al. |
| 9,185,095 | B1 | 11/2015 | Moritz et al. |
| 9,189,527 | B2 | 11/2015 | Park et al. |
| 9,196,009 | B2 | 11/2015 | Drees et al. |
| 9,229,966 | B2 | 1/2016 | Aymeloglu et al. |
| 9,286,582 | B2 | 3/2016 | Drees et al. |
| 9,311,807 | B2 | 4/2016 | Schultz et al. |
| 9,344,751 | B1 | 5/2016 | Ream et al. |
| 9,354,968 | B2 | 5/2016 | Wenzel et al. |
| 9,507,686 | B2 | 11/2016 | Horn et al. |
| 9,524,594 | B2 | 12/2016 | Ouyang et al. |
| 9,558,196 | B2 | 1/2017 | Johnston et al. |
| 9,652,813 | B2 | 5/2017 | Gifford et al. |
| 9,703,276 | B2 | 7/2017 | Piaskowski et al. |
| 9,753,455 | B2 | 9/2017 | Drees |
| 9,811,249 | B2 | 11/2017 | Chen et al. |
| 9,838,844 | B2 | 12/2017 | Emeis et al. |
| 9,886,478 | B2 | 2/2018 | Mukherjee |
| 9,948,359 | B2 | 4/2018 | Horton |
| 10,055,114 | B2 | 8/2018 | Shah et al. |
| 10,055,206 | B2 | 8/2018 | Park et al. |
| 10,116,461 | B2 | 10/2018 | Fairweather et al. |
| 10,139,792 | B2 | 11/2018 | Schmitt et al. |
| 10,149,141 | B1 | 12/2018 | Stamatakis et al. |
| 10,169,454 | B2 | 1/2019 | Ait-Mokhtar et al. |
| 10,171,297 | B2 | 1/2019 | Stewart et al. |
| 10,171,586 | B2 | 1/2019 | Shaashua et al. |
| 10,187,258 | B2 | 1/2019 | Nagesh et al. |
| 10,345,772 | B2 | 7/2019 | Piaskowski et al. |
| 10,514,963 | B2 | 12/2019 | Shrivastava et al. |
| 10,515,098 | B2 | 12/2019 | Park et al. |
| 10,527,306 | B2 | 1/2020 | Boettcher et al. |
| 10,534,326 | B2 | 1/2020 | Sridharan et al. |
| 10,536,295 | B2 | 1/2020 | Fairweather et al. |
| 10,558,183 | B2 | 2/2020 | Piaskowski et al. |
| 10,564,993 | B2 | 2/2020 | Deutsch et al. |
| 10,649,419 | B2 | 5/2020 | Asp et al. |
| 10,659,919 | B1* | 5/2020 | Li ................. G01S 5/0244 |
| 10,684,033 | B2 | 6/2020 | Sinha et al. |
| 10,705,492 | B2 | 7/2020 | Harvey |
| 10,708,078 | B2 | 7/2020 | Harvey |
| 10,739,733 | B1* | 8/2020 | Saxena ............ G05B 19/042 |
| 10,760,815 | B2 | 9/2020 | Janakiraman et al. |
| 10,762,475 | B2 | 9/2020 | Song et al. |
| 10,775,988 | B2 | 9/2020 | Narain et al. |
| 10,798,175 | B1* | 10/2020 | Knight ................. H04L 67/12 |
| 10,824,120 | B2 | 11/2020 | Ahmed |
| 10,845,771 | B2 | 11/2020 | Harvey |
| 10,853,717 | B2 | 12/2020 | Abramson et al. |
| 10,854,194 | B2 | 12/2020 | Park et al. |
| 10,862,928 | B1 | 12/2020 | Badawy et al. |
| 10,921,760 | B2 | 2/2021 | Harvey |
| 10,921,972 | B2 | 2/2021 | Park et al. |
| 10,921,973 | B2 | 2/2021 | Park et al. |
| 10,956,842 | B2* | 3/2021 | Wenzel ............... G05B 13/021 |
| 10,969,133 | B2 | 4/2021 | Harvey |

(56) References Cited

U.S. PATENT DOCUMENTS

| | | |
|---|---|---|
| 10,986,121 B2 | 4/2021 | Stockdale et al. |
| 10,997,325 B2 | 5/2021 | Austern et al. |
| 11,016,998 B2 | 5/2021 | Park et al. |
| 11,024,292 B2 | 6/2021 | Park et al. |
| 11,038,709 B2 | 6/2021 | Park et al. |
| 11,041,650 B2 | 6/2021 | Li et al. |
| 11,049,317 B2 | 6/2021 | Besecker et al. |
| 11,054,796 B2 | 7/2021 | Holaso |
| 11,070,390 B2 | 7/2021 | Park et al. |
| 11,073,976 B2 | 7/2021 | Park et al. |
| 11,087,054 B2 | 8/2021 | Austern et al. |
| 11,108,587 B2 | 8/2021 | Park et al. |
| 11,113,295 B2 | 9/2021 | Park et al. |
| 11,190,578 B2 | 11/2021 | Kitchen et al. |
| 11,221,601 B1 | 1/2022 | Chakraborty et al. |
| 11,229,138 B1 | 1/2022 | Harvey et al. |
| 11,272,011 B1 | 3/2022 | Laughton et al. |
| 11,275,870 B2 | 3/2022 | Diguet et al. |
| 11,314,726 B2 | 4/2022 | Park et al. |
| 11,314,788 B2 | 4/2022 | Park et al. |
| 11,392,736 B2 | 7/2022 | Austern et al. |
| 11,473,804 B2 | 10/2022 | Chen et al. |
| 11,499,738 B2 | 11/2022 | Ratakonda et al. |
| 11,520,955 B2 | 12/2022 | Levy et al. |
| 11,556,105 B2 | 1/2023 | Cooley et al. |
| 11,561,522 B2 | 1/2023 | Cooley et al. |
| 11,561,523 B2 | 1/2023 | Cooley et al. |
| 11,573,551 B2 | 2/2023 | Cooley et al. |
| 11,586,167 B2 | 2/2023 | Cooley et al. |
| 2002/0010562 A1 | 1/2002 | Schleiss et al. |
| 2002/0016639 A1 | 2/2002 | Smith et al. |
| 2002/0059229 A1 | 5/2002 | Natsumeda et al. |
| 2002/0091738 A1 | 7/2002 | Rohrabaugh et al. |
| 2002/0123864 A1 | 9/2002 | Eryurek et al. |
| 2002/0147506 A1 | 10/2002 | Eryurek et al. |
| 2002/0177909 A1 | 11/2002 | Fu et al. |
| 2003/0005486 A1 | 1/2003 | Ridolfo et al. |
| 2003/0014130 A1 | 1/2003 | Grumelart |
| 2003/0073432 A1 | 4/2003 | Meade, II |
| 2003/0158704 A1 | 8/2003 | Triginai et al. |
| 2003/0171851 A1 | 9/2003 | Brickfield et al. |
| 2003/0200059 A1 | 10/2003 | Ignatowski et al. |
| 2004/0068390 A1 | 4/2004 | Saunders |
| 2004/0128314 A1 | 7/2004 | Katibah et al. |
| 2004/0133314 A1 | 7/2004 | Ehlers et al. |
| 2004/0199360 A1 | 10/2004 | Friman et al. |
| 2005/0055308 A1 | 3/2005 | Meyer et al. |
| 2005/0108262 A1 | 5/2005 | Fawcett et al. |
| 2005/0131657 A1 | 6/2005 | Sean Mei |
| 2005/0154494 A1 | 7/2005 | Ahmed |
| 2005/0278703 A1 | 12/2005 | Lo et al. |
| 2005/0283337 A1 | 12/2005 | Sayal |
| 2006/0095521 A1 | 5/2006 | Patinkin |
| 2006/0140207 A1 | 6/2006 | Eschbach et al. |
| 2006/0184479 A1 | 8/2006 | Levine |
| 2006/0200476 A1 | 9/2006 | Gottumukkala et al. |
| 2006/0265751 A1 | 11/2006 | Cosquer et al. |
| 2006/0271589 A1 | 11/2006 | Horowitz et al. |
| 2007/0028179 A1 | 2/2007 | Levin et al. |
| 2007/0203693 A1 | 8/2007 | Estes |
| 2007/0261062 A1 | 11/2007 | Bansal et al. |
| 2007/0273497 A1 | 11/2007 | Kuroda et al. |
| 2007/0273610 A1 | 11/2007 | Baillot |
| 2008/0015823 A1 | 1/2008 | Arnold et al. |
| 2008/0034425 A1 | 2/2008 | Overcash et al. |
| 2008/0094230 A1 | 4/2008 | Mock et al. |
| 2008/0097816 A1 | 4/2008 | Freire et al. |
| 2008/0186160 A1 | 8/2008 | Kim et al. |
| 2008/0249756 A1 | 10/2008 | Chaisuparasmikul |
| 2008/0252723 A1 | 10/2008 | Park |
| 2008/0281472 A1 | 11/2008 | Podgorny et al. |
| 2009/0195349 A1 | 8/2009 | Frader-Thompson et al. |
| 2010/0045439 A1 | 2/2010 | Tak et al. |
| 2010/0058248 A1 | 3/2010 | Park |
| 2010/0131533 A1 | 5/2010 | Ortiz |
| 2010/0262313 A1 | 10/2010 | Chambers et al. |
| 2010/0274366 A1 | 10/2010 | Fata et al. |
| 2010/0281387 A1 | 11/2010 | Holland et al. |
| 2010/0286937 A1 | 11/2010 | Hedley et al. |
| 2010/0324962 A1 | 12/2010 | Nesler et al. |
| 2011/0015802 A1 | 1/2011 | Imes |
| 2011/0047418 A1 | 2/2011 | Drees et al. |
| 2011/0061015 A1 | 3/2011 | Drees et al. |
| 2011/0071685 A1 | 3/2011 | Huneycutt et al. |
| 2011/0077950 A1 | 3/2011 | Hughston |
| 2011/0087650 A1 | 4/2011 | Mackay |
| 2011/0087988 A1 | 4/2011 | Ray et al. |
| 2011/0088000 A1 | 4/2011 | Mackay |
| 2011/0125737 A1 | 5/2011 | Pothering et al. |
| 2011/0137853 A1 | 6/2011 | Mackay |
| 2011/0153603 A1 | 6/2011 | Adiba et al. |
| 2011/0154363 A1 | 6/2011 | Karmarkar |
| 2011/0157357 A1 | 6/2011 | Weisensale et al. |
| 2011/0178977 A1 | 7/2011 | Drees |
| 2011/0191343 A1 | 8/2011 | Heaton et al. |
| 2011/0205022 A1 | 8/2011 | Cavallaro et al. |
| 2011/0218777 A1 | 9/2011 | Chen et al. |
| 2012/0011126 A1 | 1/2012 | Park et al. |
| 2012/0011141 A1 | 1/2012 | Park et al. |
| 2012/0022698 A1 | 1/2012 | Mackay |
| 2012/0062577 A1 | 3/2012 | Nixon |
| 2012/0064923 A1 | 3/2012 | Imes et al. |
| 2012/0083930 A1 | 4/2012 | Ilic et al. |
| 2012/0100825 A1 | 4/2012 | Sherman et al. |
| 2012/0101637 A1 | 4/2012 | Imes et al. |
| 2012/0135759 A1 | 5/2012 | Imes et al. |
| 2012/0136485 A1 | 5/2012 | Weber et al. |
| 2012/0143516 A1* | 6/2012 | Mezic .................... G01R 19/00 702/24 |
| 2012/0158633 A1 | 6/2012 | Eder |
| 2012/0259583 A1 | 10/2012 | Noboa et al. |
| 2012/0272228 A1 | 10/2012 | Marndi et al. |
| 2012/0278051 A1 | 11/2012 | Jiang et al. |
| 2012/0310602 A1 | 12/2012 | Jacobi et al. |
| 2013/0007063 A1 | 1/2013 | Kalra et al. |
| 2013/0038430 A1 | 2/2013 | Blower et al. |
| 2013/0038707 A1 | 2/2013 | Cunningham et al. |
| 2013/0060820 A1 | 3/2013 | Bulusu et al. |
| 2013/0086497 A1 | 4/2013 | Ambuhl et al. |
| 2013/0097706 A1 | 4/2013 | Titonis et al. |
| 2013/0103221 A1 | 4/2013 | Raman et al. |
| 2013/0167035 A1 | 6/2013 | Imes et al. |
| 2013/0170710 A1 | 7/2013 | Kuoch et al. |
| 2013/0204836 A1 | 8/2013 | Choi et al. |
| 2013/0246916 A1 | 9/2013 | Reimann et al. |
| 2013/0247205 A1 | 9/2013 | Schrecker et al. |
| 2013/0257850 A1 | 10/2013 | Chen et al. |
| 2013/0262035 A1 | 10/2013 | Mills |
| 2013/0275174 A1 | 10/2013 | Bennett et al. |
| 2013/0275908 A1 | 10/2013 | Reichard |
| 2013/0297050 A1 | 11/2013 | Reichard et al. |
| 2013/0298244 A1 | 11/2013 | Kumar et al. |
| 2013/0303193 A1 | 11/2013 | Dharwada et al. |
| 2013/0331995 A1 | 12/2013 | Rosen |
| 2013/0338970 A1 | 12/2013 | Reghetti |
| 2014/0018940 A1 | 1/2014 | Casilli |
| 2014/0032506 A1 | 1/2014 | Hoey et al. |
| 2014/0035726 A1 | 2/2014 | Schoner et al. |
| 2014/0039685 A1 | 2/2014 | Blount et al. |
| 2014/0059483 A1 | 2/2014 | Mairs et al. |
| 2014/0081652 A1 | 3/2014 | Klindworth |
| 2014/0135952 A1 | 5/2014 | Maehara |
| 2014/0152651 A1 | 6/2014 | Chen et al. |
| 2014/0172184 A1 | 6/2014 | Schmidt et al. |
| 2014/0180646 A1 | 6/2014 | Diguet et al. |
| 2014/0189861 A1 | 7/2014 | Gupta et al. |
| 2014/0207282 A1 | 7/2014 | Angle et al. |
| 2014/0258052 A1 | 9/2014 | Khuti et al. |
| 2014/0269614 A1 | 9/2014 | Maguire et al. |
| 2014/0277765 A1 | 9/2014 | Karimi et al. |
| 2014/0278461 A1 | 9/2014 | Artz |
| 2014/0327555 A1 | 11/2014 | Sager et al. |
| 2014/0327670 A1 | 11/2014 | Chen et al. |
| 2015/0019174 A1 | 1/2015 | Kiff et al. |

(56) References Cited

U.S. PATENT DOCUMENTS

| | | |
|---|---|---|
| 2015/0042240 A1 | 2/2015 | Aggarwal et al. |
| 2015/0105917 A1 | 4/2015 | Sasaki et al. |
| 2015/0145468 A1 | 5/2015 | Ma et al. |
| 2015/0156031 A1 | 6/2015 | Fadell et al. |
| 2015/0168931 A1 | 6/2015 | Jin |
| 2015/0169791 A1 | 6/2015 | Lavrov et al. |
| 2015/0172300 A1 | 6/2015 | Cochenour |
| 2015/0178421 A1 | 6/2015 | Borrelli et al. |
| 2015/0185261 A1 | 7/2015 | Frader-Thompson et al. |
| 2015/0186777 A1 | 7/2015 | Lecue et al. |
| 2015/0202962 A1 | 7/2015 | Habashima et al. |
| 2015/0204563 A1 | 7/2015 | Imes et al. |
| 2015/0235267 A1 | 8/2015 | Steube et al. |
| 2015/0241895 A1 | 8/2015 | Lu et al. |
| 2015/0244730 A1 | 8/2015 | Vu et al. |
| 2015/0244732 A1 | 8/2015 | Golshan et al. |
| 2015/0261863 A1 | 9/2015 | Dey et al. |
| 2015/0263900 A1 | 9/2015 | Polyakov et al. |
| 2015/0286969 A1 | 10/2015 | Warner et al. |
| 2015/0295796 A1 | 10/2015 | Hsiao et al. |
| 2015/0304193 A1 | 10/2015 | Ishii et al. |
| 2015/0316918 A1 | 11/2015 | Schleiss et al. |
| 2015/0324422 A1 | 11/2015 | Elder |
| 2015/0341212 A1 | 11/2015 | Hsiao et al. |
| 2015/0348417 A1 | 12/2015 | Ignaczak et al. |
| 2015/0379080 A1 | 12/2015 | Jochimski |
| 2016/0011753 A1 | 1/2016 | Mcfarland et al. |
| 2016/0033946 A1 | 2/2016 | Zhu et al. |
| 2016/0035246 A1 | 2/2016 | Curtis |
| 2016/0065601 A1 | 3/2016 | Gong et al. |
| 2016/0070736 A1 | 3/2016 | Swan et al. |
| 2016/0078229 A1 | 3/2016 | Gong et al. |
| 2016/0090839 A1 | 3/2016 | Stolarczyk |
| 2016/0119434 A1 | 4/2016 | Dong et al. |
| 2016/0127712 A1 | 5/2016 | Alfredsson et al. |
| 2016/0139752 A1 | 5/2016 | Shim et al. |
| 2016/0163186 A1 | 6/2016 | Davidson et al. |
| 2016/0170390 A1 | 6/2016 | Xie et al. |
| 2016/0171862 A1 | 6/2016 | Das et al. |
| 2016/0173816 A1 | 6/2016 | Huenerfauth et al. |
| 2016/0179315 A1 | 6/2016 | Sarao et al. |
| 2016/0179342 A1 | 6/2016 | Sarao et al. |
| 2016/0179990 A1 | 6/2016 | Sarao et al. |
| 2016/0195856 A1 | 7/2016 | Spero |
| 2016/0212165 A1 | 7/2016 | Singla et al. |
| 2016/0239660 A1 | 8/2016 | Azvine et al. |
| 2016/0239756 A1 | 8/2016 | Aggour et al. |
| 2016/0247129 A1 | 8/2016 | Song et al. |
| 2016/0260063 A1 | 9/2016 | Harris et al. |
| 2016/0266771 A1 | 9/2016 | Kittredge et al. |
| 2016/0305678 A1 | 10/2016 | Pavlovski et al. |
| 2016/0313751 A1 | 10/2016 | Risbeck et al. |
| 2016/0313752 A1 | 10/2016 | Przybylski |
| 2016/0313902 A1 | 10/2016 | Hill et al. |
| 2016/0350364 A1 | 12/2016 | Anicic et al. |
| 2016/0357521 A1 | 12/2016 | Zhang et al. |
| 2016/0357828 A1 | 12/2016 | Tobin et al. |
| 2016/0358432 A1 | 12/2016 | Branscomb et al. |
| 2016/0363336 A1 | 12/2016 | Roth et al. |
| 2016/0370258 A1 | 12/2016 | Perez |
| 2016/0378306 A1 | 12/2016 | Kresl et al. |
| 2016/0379326 A1 | 12/2016 | Chan-Gove et al. |
| 2017/0006135 A1 | 1/2017 | Siebel |
| 2017/0011318 A1 | 1/2017 | Vigano et al. |
| 2017/0017221 A1 | 1/2017 | Lamparter et al. |
| 2017/0039255 A1 | 2/2017 | Raj et al. |
| 2017/0046012 A1 | 2/2017 | Han et al. |
| 2017/0052536 A1 | 2/2017 | Warner et al. |
| 2017/0053441 A1 | 2/2017 | Nadumane et al. |
| 2017/0063894 A1 | 3/2017 | Muddu et al. |
| 2017/0068409 A1 | 3/2017 | Nair |
| 2017/0070775 A1 | 3/2017 | Taxier et al. |
| 2017/0075984 A1 | 3/2017 | Deshpande et al. |
| 2017/0084168 A1 | 3/2017 | Janchookiat |
| 2017/0090437 A1 | 3/2017 | Veeramani et al. |
| 2017/0090441 A1 | 3/2017 | Schmitt et al. |
| 2017/0093700 A1 | 3/2017 | Gilley et al. |
| 2017/0098086 A1 | 4/2017 | Hoernecke et al. |
| 2017/0103327 A1 | 4/2017 | Penilla et al. |
| 2017/0103403 A1 | 4/2017 | Chu et al. |
| 2017/0115642 A1 | 4/2017 | Sridharan et al. |
| 2017/0123389 A1 | 5/2017 | Baez et al. |
| 2017/0134415 A1 | 5/2017 | Muddu et al. |
| 2017/0177715 A1 | 6/2017 | Chang et al. |
| 2017/0180147 A1 | 6/2017 | Brandman et al. |
| 2017/0188216 A1 | 6/2017 | Koskas et al. |
| 2017/0208151 A1* | 7/2017 | Gil ..................... H04L 67/1097 |
| 2017/0212482 A1 | 7/2017 | Boettcher et al. |
| 2017/0212668 A1 | 7/2017 | Shah et al. |
| 2017/0220641 A1 | 8/2017 | Chi et al. |
| 2017/0230930 A1 | 8/2017 | Frey |
| 2017/0235817 A1 | 8/2017 | Deodhar et al. |
| 2017/0251182 A1 | 8/2017 | Siminoff et al. |
| 2017/0270124 A1 | 9/2017 | Nagano et al. |
| 2017/0277769 A1 | 9/2017 | Pasupathy et al. |
| 2017/0278003 A1 | 9/2017 | Liu |
| 2017/0294132 A1 | 10/2017 | Colmenares |
| 2017/0300214 A1 | 10/2017 | Roundtree |
| 2017/0315522 A1 | 11/2017 | Kwon et al. |
| 2017/0315697 A1 | 11/2017 | Jacobson et al. |
| 2017/0322534 A1 | 11/2017 | Sinha et al. |
| 2017/0323389 A1 | 11/2017 | Vavrasek |
| 2017/0329289 A1 | 11/2017 | Kohn et al. |
| 2017/0329292 A1 | 11/2017 | Piaskowski et al. |
| 2017/0336770 A1 | 11/2017 | Macmillan |
| 2017/0345287 A1 | 11/2017 | Fuller et al. |
| 2017/0351957 A1 | 12/2017 | Lecue et al. |
| 2017/0357225 A1 | 12/2017 | Asp et al. |
| 2017/0357490 A1 | 12/2017 | Park et al. |
| 2017/0357738 A1 | 12/2017 | Garske et al. |
| 2017/0357908 A1 | 12/2017 | Cabadi et al. |
| 2018/0011620 A1 | 1/2018 | Troy et al. |
| 2018/0012159 A1 | 1/2018 | Kozloski et al. |
| 2018/0013579 A1 | 1/2018 | Fairweather et al. |
| 2018/0024520 A1 | 1/2018 | Sinha et al. |
| 2018/0039238 A1 | 2/2018 | Gartner et al. |
| 2018/0046173 A1* | 2/2018 | Ahmed ..................... G05B 13/0265 |
| 2018/0048485 A1 | 2/2018 | Pelton et al. |
| 2018/0069932 A1 | 3/2018 | Tiwari et al. |
| 2018/0088789 A1 | 3/2018 | Han et al. |
| 2018/0114140 A1 | 4/2018 | Chen et al. |
| 2018/0137288 A1 | 5/2018 | Polyakov |
| 2018/0157930 A1 | 6/2018 | Rutschman et al. |
| 2018/0162400 A1 | 6/2018 | Abdar |
| 2018/0176241 A1 | 6/2018 | Manadhata et al. |
| 2018/0198627 A1 | 7/2018 | Mullins |
| 2018/0203961 A1 | 7/2018 | Aisu et al. |
| 2018/0218540 A1 | 8/2018 | Sridharan et al. |
| 2018/0239982 A1 | 8/2018 | Rutschman et al. |
| 2018/0259209 A1 | 9/2018 | Przybylski |
| 2018/0259934 A1 | 9/2018 | Piaskowski et al. |
| 2018/0268319 A1 | 9/2018 | Guo et al. |
| 2018/0275625 A1 | 9/2018 | Park et al. |
| 2018/0276962 A1 | 9/2018 | Butler et al. |
| 2018/0292797 A1 | 10/2018 | Lamparter et al. |
| 2018/0336785 A1 | 11/2018 | Ghannam et al. |
| 2018/0356775 A1 | 12/2018 | Harvey |
| 2018/0359111 A1* | 12/2018 | Harvey ..................... H04L 12/2816 |
| 2018/0364654 A1 | 12/2018 | Locke et al. |
| 2019/0005025 A1 | 1/2019 | Malabarba |
| 2019/0012728 A1 | 1/2019 | Horn |
| 2019/0013023 A1 | 1/2019 | Pourmohammad et al. |
| 2019/0025771 A1 | 1/2019 | Park et al. |
| 2019/0033799 A1* | 1/2019 | Billings ..................... G06N 20/00 |
| 2019/0037135 A1 | 1/2019 | Hedge |
| 2019/0042988 A1 | 2/2019 | Brown et al. |
| 2019/0088106 A1 | 3/2019 | Grundstrom |
| 2019/0094824 A1 | 3/2019 | Xie et al. |
| 2019/0096217 A1 | 3/2019 | Pourmohammad et al. |
| 2019/0102840 A1 | 4/2019 | Perl et al. |
| 2019/0121801 A1 | 4/2019 | Jethwa et al. |
| 2019/0138512 A1 | 5/2019 | Pourmohammad et al. |
| 2019/0147883 A1 | 5/2019 | Mellenthin et al. |
| 2019/0158309 A1* | 5/2019 | Park ..................... H04L 12/2827 |

(56) References Cited

U.S. PATENT DOCUMENTS

| | | |
|---|---|---|
| 2019/0163152 A1 | 5/2019 | Worrall et al. |
| 2019/0196784 A1 | 6/2019 | Sheffer |
| 2019/0208018 A1* | 7/2019 | Scanlin .................. F24F 11/63 |
| 2019/0265659 A1 | 8/2019 | Piaskowski et al. |
| 2019/0268178 A1 | 8/2019 | Fairweather et al. |
| 2019/0310979 A1 | 10/2019 | Masuzaki et al. |
| 2019/0347381 A1 | 11/2019 | Benjamin et al. |
| 2019/0369575 A1 | 12/2019 | Raina et al. |
| 2019/0377306 A1 | 12/2019 | Harvey |
| 2019/0384242 A1 | 12/2019 | Holaso |
| 2020/0026806 A1 | 1/2020 | Ullom |
| 2020/0044887 A1 | 2/2020 | Jayanath Wewalaarachchi et al. |
| 2020/0047343 A1* | 2/2020 | Bal ...................... A47L 11/4038 |
| 2020/0090085 A1 | 3/2020 | Martinez Canedo et al. |
| 2020/0104530 A1 | 4/2020 | Park et al. |
| 2020/0106633 A1* | 4/2020 | Park .................... H04L 12/2823 |
| 2020/0124466 A1* | 4/2020 | Lubas ....................... G01J 1/06 |
| 2020/0125043 A1 | 4/2020 | Park |
| 2020/0159173 A1 | 5/2020 | Goyal |
| 2020/0159182 A1 | 5/2020 | Goyal |
| 2020/0159376 A1 | 5/2020 | Goyal |
| 2020/0159723 A1 | 5/2020 | Goyal |
| 2020/0162354 A1* | 5/2020 | Drees ..................... G06N 3/045 |
| 2020/0188718 A1* | 6/2020 | Trivelpiece ........ A62C 99/0072 |
| 2020/0202136 A1* | 6/2020 | Shrestha .............. G06K 9/3233 |
| 2020/0225623 A1 | 7/2020 | Vass et al. |
| 2020/0226156 A1 | 7/2020 | Borra et al. |
| 2020/0226223 A1 | 7/2020 | Reichl |
| 2020/0233680 A1* | 7/2020 | Ma .......................... G06Q 10/10 |
| 2020/0272114 A1 | 8/2020 | Grabowski et al. |
| 2020/0285203 A1 | 9/2020 | Thakur et al. |
| 2020/0285855 A1 | 9/2020 | Brebner |
| 2020/0304375 A1* | 9/2020 | Chennai .................. G06T 17/05 |
| 2020/0336328 A1 | 10/2020 | Harvey |
| 2020/0348632 A1 | 11/2020 | Harvey |
| 2020/0379140 A1* | 12/2020 | Kostrun ............. G06K 9/00771 |
| 2020/0387576 A1 | 12/2020 | Brett et al. |
| 2020/0387643 A1 | 12/2020 | Lee |
| 2020/0396208 A1 | 12/2020 | Brett et al. |
| 2021/0042299 A1 | 2/2021 | Migliori |
| 2021/0043221 A1 | 2/2021 | Yelchuru et al. |
| 2021/0055716 A1 | 2/2021 | Turner |
| 2021/0073430 A1 | 3/2021 | Levy et al. |
| 2021/0073433 A1 | 3/2021 | Austern et al. |
| 2021/0073449 A1 | 3/2021 | Segev et al. |
| 2021/0208002 A1 | 7/2021 | Meggers et al. |
| 2021/0256583 A1 | 8/2021 | Jacobs et al. |
| 2021/0325070 A1 | 10/2021 | Endel et al. |
| 2021/0342961 A1 | 11/2021 | Winter et al. |
| 2021/0365602 A1 | 11/2021 | Gifford |
| 2021/0381711 A1 | 12/2021 | Harvey et al. |
| 2021/0381712 A1 | 12/2021 | Harvey et al. |
| 2021/0382445 A1 | 12/2021 | Harvey et al. |
| 2021/0382449 A1 | 12/2021 | Krishnan et al. |
| 2021/0382451 A1 | 12/2021 | Bharathi et al. |
| 2021/0382452 A1 | 12/2021 | Krishnan et al. |
| 2021/0382474 A1 | 12/2021 | Krishnan et al. |
| 2021/0383041 A1 | 12/2021 | Harvey et al. |
| 2021/0383042 A1 | 12/2021 | Harvey et al. |
| 2021/0383200 A1 | 12/2021 | Harvey et al. |
| 2021/0383219 A1 | 12/2021 | Harvey et al. |
| 2021/0383235 A1 | 12/2021 | Harvey et al. |
| 2021/0383236 A1 | 12/2021 | Harvey et al. |
| 2021/0389968 A1 | 12/2021 | Majewski et al. |
| 2022/0066402 A1 | 3/2022 | Harvey et al. |
| 2022/0066405 A1 | 3/2022 | Harvey |
| 2022/0066432 A1 | 3/2022 | Harvey et al. |
| 2022/0066434 A1 | 3/2022 | Harvey et al. |
| 2022/0066528 A1 | 3/2022 | Harvey et al. |
| 2022/0066722 A1 | 3/2022 | Harvey et al. |
| 2022/0066754 A1 | 3/2022 | Harvey et al. |
| 2022/0066761 A1 | 3/2022 | Harvey et al. |
| 2022/0067226 A1 | 3/2022 | Harvey et al. |
| 2022/0067227 A1 | 3/2022 | Harvey et al. |
| 2022/0067230 A1 | 3/2022 | Harvey et al. |
| 2022/0069863 A1 | 3/2022 | Harvey et al. |
| 2022/0070293 A1 | 3/2022 | Harvey et al. |
| 2022/0092227 A1 | 3/2022 | Yin et al. |
| 2022/0121965 A1 | 4/2022 | Chatterji et al. |
| 2022/0138684 A1 | 5/2022 | Harvey |
| 2022/0147000 A1 | 5/2022 | Cooley et al. |
| 2022/0150124 A1* | 5/2022 | Cooley ................. G06F 16/212 |
| 2022/0215264 A1 | 7/2022 | Harvey et al. |
| 2022/0268470 A1 | 8/2022 | Hriljac et al. |
| 2023/0010757 A1 | 1/2023 | Preciado |
| 2023/0071312 A1 | 3/2023 | Preciado et al. |
| 2023/0076011 A1 | 3/2023 | Preciado et al. |
| 2023/0083703 A1 | 3/2023 | Meiners |

FOREIGN PATENT DOCUMENTS

| | | |
|---|---|---|
| AU | 2019351573 A1 | 5/2021 |
| CN | 101415011 A | 4/2009 |
| CN | 102136099 A | 7/2011 |
| CN | 102136100 A | 7/2011 |
| CN | 102650876 A | 8/2012 |
| CN | 104040583 A | 9/2014 |
| CN | 104603832 A | 5/2015 |
| CN | 104919484 A | 9/2015 |
| CN | 106204392 A | 12/2016 |
| CN | 106406806 A | 2/2017 |
| CN | 106960269 A | 7/2017 |
| CN | 107147639 A1 | 9/2017 |
| CN | 107598928 A | 1/2018 |
| CN | 109824100 A | 5/2019 |
| EP | 2 528 033 A1 | 11/2012 |
| EP | 3 268 821 B1 | 1/2018 |
| EP | 3 324 306 A1 | 5/2018 |
| EP | 4 226 263 A1 | 8/2023 |
| JP | H10-049552 A | 2/1998 |
| JP | 2003-162573 A | 6/2003 |
| JP | 2007-018322 A | 1/2007 |
| JP | 4073946 B1 | 4/2008 |
| JP | 2008-107930 A | 5/2008 |
| JP | 2013-152618 A | 8/2013 |
| JP | 2014-044457 A | 3/2014 |
| KR | 2016/0102923 A | 8/2016 |
| WO | WO-2009/020158 A1 | 2/2009 |
| WO | WO-2011/100255 A2 | 8/2011 |
| WO | WO-2013/050333 A1 | 4/2013 |
| WO | WO-2015/106702 A1 | 7/2015 |
| WO | WO-2015/145648 A1 | 10/2015 |
| WO | WO-2017/035536 A1 | 3/2017 |
| WO | WO-2017/192422 A1 | 11/2017 |
| WO | WO-2017/194244 A1 | 11/2017 |
| WO | WO-2017/205330 A1 | 11/2017 |
| WO | WO-2017/213918 A1 | 12/2017 |
| WO | WO2018/0132112 A1 | 7/2018 |
| WO | WO-2020/061621 A1 | 4/2020 |
| WO | WO-2022/042925 A1 | 3/2022 |
| WO | WO-2022/103812 A1 | 5/2022 |
| WO | WO-2022/103813 A1 | 5/2022 |
| WO | WO-2022/103820 A1 | 5/2022 |
| WO | WO-2022/103822 A1 | 5/2022 |
| WO | WO-2022/103824 A1 | 5/2022 |
| WO | WO-2022/103829 A1 | 5/2022 |
| WO | WO-2022/103831 A1 | 5/2022 |

OTHER PUBLICATIONS

U.S. Appl. No. 16/885,968 filed May 28, 2020, Johnson Controls Technology Co.

"OpenRefine: A free, open source, powerful tool for working with messy data," URL: https://openrefine.org/, retrieved Feb. 11, 2021, 4 pages.

International Search Report and Written Opinion on PCT/US2017/013647, dated Apr. 18, 2017, 10 pages.

International Search Report and Written Opinion for PCT Appl. Ser. No. PCT/US2021/057360 dated Feb. 1, 2022 (14 pages).

Balaji et al, "Brick: Metadata schema for portable smart building applications," Applied Energy, 2018 (20 pages).

Balaji et al, "Brick: Metadata schema for portable smart building applications," Applied Energy, Sep. 15, 2018, 3 pages, (Abstract).

(56) References Cited

OTHER PUBLICATIONS

Balaji et al, "Demo Abstract: Portable Queries Using the Brick Schema for Building Applications," BuildSys '16, Palo Alto, CA, USA, Nov. 16-17, 2016 (2 pages).

Balaji, B et al., "Brick: Towards a Unified Metadata Schema For Buildings." BuildSys '16, Palo Alto, CA, USA, Nov. 16-17, 2016 (10 pages).

Bhattacharya et al., "Short Paper: Analyzing Metadata Schemas for Buildings—The Good, The Bad and The Ugly," BuildSys '15, Seoul, South Korea, Nov. 4-5, 2015 (4 pages).

Bhattacharya, A., "Enabling Scalable Smart-Building Analytics," Electrical Engineering and Computer Sciences, University of California at Berkeley, Technical Report No. UCB/EECS-2016-201, Dec. 15, 2016 (121 pages).

Brick, "Brick Schema: Building Blocks for Smart Buildings," URL: chrome-extension://efaidnbmnnnibpcajpcglclefindmkaj/https://www.memoori.com/wp-content/uploads/2016/06/Brick_Schema_Whitepaper.pdf, Mar. 2019 (17 pages).

Brick, "Brick: Towards a Unified Metadata Schema For Buildings," URL: chrome-extension://efaidnbmnnnibpcajpcglclefindmkaj/https://brickschema.org/papers/Brick_BuildSys_Presentation.pdf, Presented at BuildSys '16, Nov. 2016 (46 pages).

Brick, "Metadata Schema for Buildings," URL: https://brickschema.org/docs/Brick-Leaflet.pdf, retrieved from internet Dec. 24, 2019 (3 pages).

Chinese Office Action on CN Appl. No. 201780003995.9 dated Apr. 8, 2021 (21 pages with English language translation).

Chinese Office action on CN Appl. No. 201780043400.2 dated Apr. 25, 2021 (15 pages with English language translation).

Curry, E. et al., "Linking building data in the cloud: Integrating cross-domain building data using linked data." Advanced Engineering Informatics, 2013, 27 (pp. 206-219).

Digital Platform Litigation Documents Part 1, includes cover letter, dismissal of case DDE-1-21-cv-01796, IPR2023-00022 (documents filed Jan. 26, 2023-Oct. 7, 2022), and IPR2023-00085 (documents filed Jan. 26, 2023-Oct. 20, 2022) (748 pages total).

Digital Platform Litigation Documents Part 10, includes DDE-1-21-cv-01796 (documents filed Nov. 1, 2022-Dec. 22, 2021 (1795 pages total).

Digital Platform Litigation Documents Part 2, includes IPR2023-00085 (documents filed Oct. 20, 2022) (172 pages total).

Digital Platform Litigation Documents Part 3, includes IPR2023-00085 (documents filed Oct. 20, 2022) and IPR2023-00170 (documents filed Nov. 28, 2022-Nov. 7, 2022) (397 pages total).

Digital Platform Litigation Documents Part 4, includes IPR2023-00170 (documents filed Nov. 7, 2022) and IPR2023-00217 (documents filed Jan. 18, 2023-Nov. 15, 2022) (434 pages total).

Digital Platform Litigation Documents Part 5, includes IPR2023-00217 (documents filed Nov. 15, 2022) and IPR2023-00257 (documents filed Jan. 25, 2023-Nov. 23, 2022) (316 pages total).

Digital Platform Litigation Documents Part 6, includes IPR2023-00257 (documents filed Nov. 23, 2022) and IPR 2023-00346 (documents filed Jan. 3, 2023-Dec. 13, 2022) (295 pages total).

Digital Platform Litigation Documents Part 7, includes IPR 2023-00346 (documents filed Dec. 13, 2022) and IPR2023-00347 (documents filed Jan. 3, 2023-Dec. 13, 2022) (217 pages total).

Digital Platform Litigation Documents Part 8, includes IPR2023-00347 (documents filed Dec. 13, 2022), EDTX-2-22-cv-00243 (documents filed Sep. 20, 2022-Jun. 29, 2022), and DDE-1-21-cv-01796 (documents filed Feb. 3, 2023-Jan. 10, 2023, (480 pages total).

Digital Platform Litigation Documents Part 9, includes DDE-1-21-cv-01796 (documents filed Jan. 10, 2023-Nov. 1, 2022 (203 pages total).

El Kaed, C. et al., "Building management insights driven by a multi-system semantic representation approach," 2016 IEEE 3rd World Forum on Internet of Things (WF-IoT), Dec. 12-14, 2016, (pp. 520-525).

Ellis, C. et al., "Creating a room connectivity graph of a building from per-room sensor units." BuildSys '12, Toronto, ON, Canada, Nov. 6, 2012 (7 pages).

Extended European Search Report on EP Application No. 18196948.6 dated Apr. 10, 2019 (9 pages).

Fierro et al., "Beyond a House of Sticks: Formalizing Metadata Tags with Brick," BuildSys '19, New York, NY, USA, Nov. 13-14, 2019 (10 pages).

Fierro et al., "Dataset: An Open Dataset and Collection Tool for BMS Point Labels," Data'19, New York, NY, USA, Nov. 10, 2019 (3 pages).

Fierro et al., "Design and Analysis of a Query Processor for Brick," ACM Transactions on Sensor Networks, Jan. 2018, vol. 1, No. 1, art. 1 (25 pages).

Fierro et al., "Design and Analysis of a Query Processor for Brick," BuildSys '17, Delft, Netherlands, Nov. 8-9, 2017 (10 pages).

Fierro et al., "Mortar: An Open Testbed for Portable Building Analytics," BuildSys '18, Shenzhen, China, Nov. 7-8, 2018 (10 pages).

Fierro et al., "Why Brick is a Game Changer for Smart Buildings," URL: https://brickschema.org/papers/Brick_Memoori_Webinar_Presentation.pdf, Memoori Webinar, 2019 (67 pages).

Fierro, "Writing Portable Building Analytics with the Brick Metadata Schema," UC Berkeley, ACM E-Energy, 2019 (39 pages).

Fierro, G., "Design of an Effective Ontology and Query Processor Enabling Portable Building Applications," Electrical Engineering and Computer Sciences, University of California at Berkeley, Technical Report No. UCB/EECS-2019-106, Jue 27, 2019 (118 pages).

File History for U.S. Appl. No. 12/776,159, filed May 7, 2010 (722 pages).

Final Conference Program, ACM BuildSys 2016, Stanford, CA, USA, Nov. 15-17, 2016 (7 pages).

Gao et al., "A large-scale evaluation of automated metadata inference approaches on sensors from air handling units," Advanced Engineering Informatics, 2018, 37 (pp. 14-30).

Harvey, T., "Quantum Part 3: The Tools of Autonomy, How PassiveLogic's Quantum Creator and Autonomy Studio software works," URL: https://www.automatedbuildings.com/news/jan22/articles/passive/211224010000passive.html, Jan. 2022 (7 pages).

Harvey, T., "Quantum: The Digital Twin Standard for Buildings," URL: https://www.automatedbuildings.com/news/feb21/articles/passivelogic/210127124501passivelogic.html, Feb. 2021 (6 pages).

Hu, S. et al., "Building performance optimisation: A hybrid architecture for the integration of contextual information and time-series data," Automation in Construction, 2016, 70 (pp. 51-61).

International Search Report and Written Opinion for PCT Appl. Ser. No. PCT/US2017/013831 dated Mar. 31, 2017 (14 pages).

International Search Report and Written Opinion for PCT Appl. Ser. No. PCT/US2017/035524 dated Jul. 24, 2017 (14 pages).

International Search Report and Written Opinion on PCT/US2017/052060, mailed Oct. 5, 2017, 11 pages.

International Search Report and Written Opinion on PCT/US2017/052633, mailed Oct. 23, 2017, 9 pages.

International Search Report and Written Opinion on PCT/US2017/052829, mailed Nov. 27, 2017, 24 pages.

International Search Report and Written Opinion on PCT/US2018/024068, mailed Jun. 15, 2018, 22 pages.

International Search Report and Written Opinion on PCT/US2018/052971, dated Mar. 1, 2019, 19 pages.

International Search Report and Written Opinion on PCT/US2018/052974, mailed Dec. 19, 2018, 13 pages.

International Search Report and Written Opinion on PCT/US2018/052975, mailed Jan. 2, 2019, 13 pages.

International Search Report and Written Opinion on PCT/US2018/052994, mailed Jan. 7, 2019, 15 pages.

International Search Report and Written Opinion on PCT/US2019/015481, dated May 17, 2019, 78 pages.

International Search Report and Written Opinion on PCT/US2020/058381, dated Jan. 27, 2021, 30 pages.

Japanese Office Action on JP Appl. No. 2018-534963 dated May 11, 2021 (16 pages with English language translation).

(56) References Cited

OTHER PUBLICATIONS

Koh et al., "Plaster: An Integration, Benchmark, and Development Framework for Metadata Normalization Methods," BuildSys '18, Shenzhen, China, Nov. 7-8, 2018 (10 pages).
Koh et al., "Scrabble: Transferrable Semi-Automated Semantic Metadata Normalization using Intermediate Representation," BuildSys '18, Shenzhen, China, Nov. 7-8, 2018 (10 pages).
Koh et al., "Who can Access What, and When?" BuildSys '19, New York, NY, USA, Nov. 13-14, 2019 (4 pages).
Li et al., "Event Stream Processing with Out-of-Order Data Arrival," International Conferences on Distributed Computing Systems, 2007, (8 pages).
Nissin Electric Co., Ltd., "Smart power supply system (SPSS)," Outline of the scale verification plan, Nissin Electric Technical Report, Japan, Apr. 23, 2014, vol. 59, No. 1 (23 pages).
Passivelogic, "Explorer: Digital Twin Standard for Autonomous Systems. Made interactive." URL: https://passivelogic.com/software/quantum-explorer/, retrieved from internet Jan. 4, 2023 (13 pages).
Passivelogic, "Quantum: The Digital Twin Standard for Autonomous Systems, A physics-based ontology for next-generation control and AI." URL: https://passivelogic.com/software/quantum-standard/, retrieved from internet Jan. 4, 2023 (20 pages).
Quantum Alliance, "Quantum Explorer Walkthrough," 2022, (7 pages) (screenshots from video).
Results of the Partial International Search for PCT/US2018/052971, dated Jan. 3, 2019, 3 pages.
Sinha, Sudhi and Al Huraimel, Khaled, "Reimagining Businesses with AI" John Wiley & Sons, Inc., Hoboken, NJ, USA, 2021 (156 pages).
Sinha, Sudhi R. and Park, Youngchoon, "Building an Effective IoT Ecosystem for Your Business," Johnson Controls International, Springer International Publishing, 2017 (286 pages).
Sinha, Sudhi, "Making Big Data Work For Your Business: A guide to effective Big Data analytics," Impackt Publishing LTD., Birmingham, UK, Oct. 2014 (170 pages).
The Virtual Nuclear Tourist, "Calvert Cliffs Nuclear Power Plant," URL: http://www.nucleartourist.com/us/calvert.htm, Jan. 11, 2006 (2 pages).
University of California At Berkeley, EECS Department, "Enabling Scalable Smart-Building Analytics," URL: https://www2.eecs.berkeley.edu/Pubs/TechRpts/2016/EECS-2016-201.html, retrieved from internet Feb. 15, 2022 (7 pages).
Van Hoof, Bert, "Announcing Azure Digital Twins: Create digital replicas of spaces and infrastructure using cloud, AI and IoT," URL: https://azure.microsoft.com/en-us/blog/announcing-azure-digital-twins-create-digital-replicas-of-spaces-and-infrastructure-using-cloud-ai-and-iot/, Sep. 24, 2018 (11 pages).
W3C, "SPARQL: Query Language for RDF," located on The Wayback Machine, URL: https://web.archive.org/web/20161230061728/http://www.w3.org/TR/rdf-sparql-query/), retrieved from internet Nov. 15, 2022 (89 pages).
Wei et al., "Development and Implementation of Software Gateways of Fire Fighting Subsystem Running on EBI," Control, Automation and Systems Engineering, IITA International Conference on, IEEE, Jul. 2009 (pp. 9-12).
White et al., "Reduce building maintenance costs with AWS IoT TwinMaker Knowledge Graph," The Internet of Things on AWS—Official Blog, URL: https://aws.amazon.com/blogs/iot/reduce-building-maintenance-costs-with-aws-iot-twinmaker-knowledge-graph/, Nov. 18, 2022 (10 pages).
Zhou, Q. et al., "Knowledge-infused and Consistent Complex Event Processing over Real-time and Persistent Streams," Further Generation Computer Systems, 2017, 76 (pp. 391-406).
U.S. Appl. No. 17/566,029, Passivelogic, Inc.
U.S. Appl. No. 17/567,275, Passivelogic, Inc.
U.S. Appl. No. 17/722,115, Passivelogic, Inc.

\* cited by examiner

| ALL | | COLUMN 1 [EDIT] |
|---|---|---|
| ☆ | ⌐ | 849. ZONE.AH1N.HALLWAY.ZONE AIR |
| ☆ | ⌐ | 850. ZONE.AH1N.RM157.DAY NIGHT |
| ☆ | ⌐ | 851. ZONE.AH1N.RM157.HEAT COOL |
| ☆ | ⌐ | 852. ZONE.AH1N.RM157.ZONE AIR TEMP |
| ☆ | ⌐ | 853. ZONE.AH1N.RM157:AUX TEMP |
| ☆ | ⌐ | 854. ZONE.AH1N.RM157:CTL STPT |
| ☆ | ⌐ | 855. ZONE.AH1N.RM157.VLV 1 COMD |
| ☆ | ⌐ | 856. ZONE.AH1N.RM159.DAY NIGHT |
| ☆ | ⌐ | 857. ZONE.AH1N.RM159.HEAT/COOL |
| ☆ | ⌐ | 858. ZONE.AH1N.RM159.ZONE AIR TEMP |
| ☆ | ⌐ | 859. ZONE.AH1N.RM159:AUX TEMP |
| ☆ | ⌐ | 860. ZONE.AH1N.RM159:CTL STPT |
| ☆ | ⌐ | 861. ZONE.AH1N.RM159:VLV 1 COMD |
| ☆ | ⌐ | 862. ZONE.AH1N.RM161.DAY NIGHT |
| ☆ | ⌐ | 863. ZONE.AH1N.RM161.HEAT COOL |
| ☆ | ⌐ | 864. ZONE.AH1N.RM161.ZONE AIR TEMP |
| ☆ | ⌐ | 865. ZONE.AH1N.RM161:AUX TEMP |
| ☆ | ⌐ | 866. ZONE.AH1N.RM161:CTL STPT |
| ☆ | ⌐ | 867. ZONE.AH1N.RM161:VLV 1 COMD |
| ☆ | ⌐ | 868. ZONE.AH1N.RM163A.DAY NIGHT |
| ☆ | ⌐ | 869. ZONE.AH1N.RM163A.HEAT COOL |
| ☆ | ⌐ | 870. ZONE.AH1N.RM163A.ZONE AIR TEMP |
| ☆ | ⌐ | 871. ZONE.AH1N.RM163A:AUX TEMP |
| ☆ | ⌐ | 872. ZONE.AH1N.RM163A:CTL STPT |
| ☆ | ⌐ | 873. ZONE.AH1N.RM163A:VLV 1 COMD |
| ☆ | ⌐ | 874. ZONE.AH1N.RM163B.DAY NIGHT |
| ☆ | ⌐ | 875. ZONE.AH1N.RM163B.HEAT COOL |
| ☆ | ⌐ | 876. ZONE.AH1N.RM163B.ZONE AIR TEMP |
| ☆ | ⌐ | 877. ZONE.AH1N.RM163B:AUX TEMP |
| ☆ | ⌐ | 878. ZONE.AH1N.RM163B:CTL STPT |
| ☆ | ⌐ | 879. ZONE.AH1N.RM163B:VLV 1 COMD |
| ☆ | ⌐ | 880. ZONE.AH1N.RM163C.DAY NIGHT |

| | ALL | | COLUMN 11 | | COLUMN 12 | | COLUMN 131 | | COLUMN 132 |
|---|---|---|---|---|---|---|---|---|---|
| ☆ | 849. | ⌐ | ZONE | | AH1N | | HALLWAY | | ZONE AIR TEMP |
| ☆ | 850. | ⌐ | ZONE | | AH1N | | RM157 | | DAY NIGHT |
| ☆ | 851. | ⌐ | ZONE | | AH1N | | RM157 | | HEAT COOL |
| ☆ | 852. | ⌐ | ZONE | | AH1N | | RM157 | | ZONE AIR TEMP |
| ☆ | 853. | ⌐ | ZONE | | AH1N | | RM157 | | AUX TEMP |
| ☆ | 854. | ⌐ | ZONE | | AH1N | | RM157 | | CTL STPT |
| ☆ | 855. | ⌐ | ZONE | | AH1N | | RM157 | | VLV 1 COMD |
| ☆ | 856. | ⌐ | ZONE | | AH1N | | RM159 | | DAY NIGHT |
| ☆ | 857. | ⌐ | ZONE | | AH1N | | RM159 | | HEAT COOL |
| ☆ | 858. | ⌐ | ZONE | | AH1N | | RM159 | | ZONE AIR TEMP |
| ☆ | 859. | ⌐ | ZONE | | AH1N | | RM159 | | AUX TEMP |
| ☆ | 860. | ⌐ | ZONE | | AH1N | | RM159 | | CTL STPT |
| ☆ | 861. | ⌐ | ZONE | | AH1N | | RM159 | | VLV 1 COMD |
| ☆ | 862. | ⌐ | ZONE | | AH1N | | RM161 | | DAY NIGHT |
| ☆ | 863. | ⌐ | ZONE | | AH1N | | RM161 | | HEAT COOL |
| ☆ | 864. | ⌐ | ZONE | | AH1N | | RM161 | | ZONE AIR TEMP |
| ☆ | 865. | ⌐ | ZONE | | AH1N | | RM161 | | AUX TEMP |
| ☆ | 866. | ⌐ | ZONE | | AH1N | | RM161 | | CTL STPT |
| ☆ | 867. | ⌐ | ZONE | | AH1N | | RM161 | | VLV 1 COMD |
| ☆ | 868. | ⌐ | ZONE | | AH1N | | RM163A | | DAY NIGHT |
| ☆ | 869. | ⌐ | ZONE | | AH1N | | RM163A | | HEAT COOL |
| ☆ | 870. | ⌐ | ZONE | | AH1N | | RM163A | | ZONE AIR TEMP |
| ☆ | 871. | ⌐ | ZONE | | AH1N | | RM163A | | AUX TEMP |
| ☆ | 872. | ⌐ | ZONE | | AH1N | | RM163A | | CTL STPT |
| ☆ | 873. | ⌐ | ZONE | | AH1N | | RM163A | | VLV 1 COMD |
| ☆ | 874. | ⌐ | ZONE | | AH1N | | RM163B | | DAY NIGHT |
| ☆ | 875. | ⌐ | ZONE | | AH1N | | RM163B | | HEAT COOL |
| ☆ | 876. | ⌐ | ZONE | | AH1N | | RM163B | | ZONE AIR TEMP |
| ☆ | 877. | ⌐ | ZONE | | AH1N | | RM163B | | AUX TEMP |
| ☆ | 878. | ⌐ | ZONE | | AH1N | | RM163B | | CTL STPT |
| ☆ | 879. | ⌐ | ZONE | | AH1N | | RM163B | | VLV 1 COMD |
| ☆ | 880. | ⌐ | ZONE | | AH1N | | RM163C | | DAY NIGHT |

SELF-CONFIGURING BUILDING MANAGEMENT SYSTEM

CROSS-REFERENCE TO RELATED PATENT APPLICATIONS

The present application claims the benefit and priority of U.S. Provisional Patent Application No. 63/108,137 filed on Oct. 30, 2020, the entire disclosure of which is incorporated by reference herein.

BACKGROUND

The present disclosure relates generally to the field of building management platforms such as a building management system. Specifically, the present disclosure relates to systems and methods for self-configuring and commissioning spaces such as buildings. Building management platforms may include entities such as controllers, sensors, or water heaters deployed within a space. Initial commissioning of new buildings and/or spaces thereof can be time-intensive and involve significant expense.

SUMMARY

One implementation of the present disclosure is a method for visualizing a building model comprising retrieving an identifier associated with a digital representation of a building asset from a digital representation representing at least a portion of a building, retrieving, using the identifier, a graphical representation of the asset from a building model having a different format than the digital representation, and rendering the graphical representation on a display device.

In various embodiments, the asset includes at least one of a space or a piece of equipment associated with the portion of the building. In various embodiments, the graphical representation of the asset is associated with a simple vector format (SVF) file. In various embodiments, the building model includes a graph data structure. In various embodiments, the building model includes a building information management (BIM) model. In various embodiments, the graphical representation of the asset is a three-dimensional representation. In various embodiments, rending the graphical representation includes displaying the graphical representation in an interface of a building management system (BMS). In various embodiments, the graphical representation of the asset includes at least one image of the asset.

Another implementation of the present disclosure is one or more non-transitory computer-readable storage media having instructions stored thereon that, when executed by one or more processors, cause the one or more processor to retrieve an identifier associated with a digital representation of a building asset from a digital representation representing at least a portion of a building, retrieve, using the identifier, a graphical representation of the asset from a building model having a different format than the digital representation, and render the graphical representation on a display device.

In various embodiments, the asset includes at least one of a space or a piece of equipment associated with the portion of the building. In various embodiments, the graphical representation of the asset is associated with a simple vector format (SVF) file. In various embodiments, the building model includes a graph data structure. In various embodiments, the building model includes a building information management (BIM) model. In various embodiments, the graphical representation of the asset is a three-dimensional representation. In various embodiments, rending the graphical representation includes displaying the graphical representation in an interface of a building management system (BMS). In various embodiments, the graphical representation of the asset includes at least one image of the asset.

Another implementation of the present disclosure is a system for visualizing a building model comprising a processing circuit including a processor and memory, the memory having instructions stored thereon that, when executed by the processor, cause the processing circuit to retrieve an identifier associated with a digital representation of a building asset from a digital representation representing at least a portion of a building, retrieve, using the identifier, a graphical representation of the asset from a building model having a different format than the digital representation, and render the graphical representation on a display device.

In various embodiments, the asset includes at least one of a space or a piece of equipment associated with the portion of the building. In various embodiments, the graphical representation of the asset is associated with a simple vector format (SVF) file. In various embodiments, the building model includes a graph data structure.

Another implementation of the present disclosure is a method of labeling building data comprising receiving, by a labeling system, a plurality of strings relating to data associated with a building, wherein the plurality of strings are received from one or more building devices, segregating the plurality of strings based on at least one semantic element included in the plurality of strings, clustering the plurality of strings based on at least one related element shared by at least a portion of the plurality of strings, labeling at least some of the plurality of strings based on the segregated and clustered plurality of strings, and generating a digital representation of the building using the labeled strings.

In various embodiments, labeling the at least some of the plurality of strings includes generating at least one of a class, a location, or an identifier associated with each of the at least some of the plurality of strings. In various embodiments, the method further comprises executing one or more predefined operators, wherein the one or more predefined operators include a series of actions. In various embodiments, labeling the at least some of the plurality of strings includes executing a machine learning algorithm to suggest labels associated with the at least some of the plurality of strings. In various embodiments, the method further comprises interacting with an external system using at least one of an application programming interface (API) or a software development kit (SDK). In various embodiments, the external system is a parsing system configured to parse at least one of the plurality of strings to extract a semantic element. In various embodiments, the external system is a lookup system configured to generate supplemental data associated with at least one of the plurality of strings. In various embodiments, labeling the at least some of the plurality of strings includes identifying information associated with one or more building assets from the plurality of strings.

Another implementation of the present disclosure is one or more non-transitory computer-readable storage media having instructions stored thereon that, when executed by one or more processors, cause the one or more processors to receive a plurality of strings relating to data associated with a building, wherein the plurality of strings are received from one or more building devices, segregate the plurality of strings based on at least one semantic element included in the plurality of strings, cluster the plurality of strings based on at least one related element shared by at least a portion of the plurality of strings, label at least some of the plurality of strings based on the segregated and clustered plurality of strings, and generate a digital representation of the building using the labeled strings.

In various embodiments, labeling the at least some of the plurality of strings includes generating at least one of a class, a location, or an identifier associated with each of the at least some of the plurality of strings. In various embodiments, the one or more processors are further configured to execute one or more predefined operators, wherein the one or more predefined operators include a series of actions. In various embodiments, labeling the at least some of the plurality of strings includes executing a machine learning algorithm to suggest labels associated with the at least some of the plurality of strings. In various embodiments, the one or more processors are further configured to interact with an external system using at least one of an application programming interface (API) or a software development kit (SDK). In various embodiments, the external system is a parsing system configured to parse at least one of the plurality of strings to extract a semantic element. In various embodiments, the external system is a lookup system configured to generate supplemental data associated with at least one of the plurality of strings. In various embodiments, labeling the at least some of the plurality of strings includes identifying information associated with one or more building assets from the plurality of strings.

Another implementation of the present disclosure is a data preprocessing and refinement tool configured to receive a plurality of strings relating to data associated with a building, wherein the plurality of strings are received from one or more building devices, segregate the plurality of strings based on at least one semantic element included in the plurality of strings, cluster the plurality of strings based on at least one related element shared by at least a portion of the plurality of strings, label at least some of the plurality of strings based on the segregated and clustered plurality of strings, and generate a digital representation of the building using the labeled strings.

In various embodiments, labeling the at least some of the plurality of strings includes generating at least one of a class, a location, or an identifier associated with each of the at least some of the plurality of strings. In various embodiments, the data preprocessing and refinement tool is further configured to execute one or more predefined operators, wherein the one or more predefined operators include a series of actions. In various embodiments, labeling the at least some of the plurality of strings includes executing a machine learning algorithm to suggest labels associated with the at least some of the plurality of strings.

Another implementation of the present disclosure is a method for commissioning a building comprising identifying a building asset within a digital representation of a building having one or more parameters describing relationships of the building asset within the building, controlling one or more other building assets included within the digital representation to change an environmental parameter of the building, monitoring a response of at least one of the building asset or one of the one or more other building assets to the change in the environmental parameter, generating a parameter for the digital representation associated with the building asset based on the monitoring, and updating the digital representation using the parameter.

In various embodiments, the parameter describes a confidence level in a validity of one of the one or more parameters. In various embodiments, the method further comprises updating at least one of the one or more parameters using the parameter. In various embodiments, generating the parameter includes analyzing a covariance between sensor measurements of the one or more other building assets associated with the change in the environmental parameter of the building. In various embodiments, the digital representation includes a graph data structure and wherein the method further comprises updating one or more portions of the graph data structure to represent a relationship of the building asset. In various embodiments, the digital representation includes a graph data structure and wherein the method further comprises comparing versions of the graph data structure representing at least a portion of the building to identify changes between the versions. In various embodiments, identifying the building asset includes selecting an asset based on an identified change between the versions of the graph data structure.

Another implementation of the present disclosure is one or more non-transitory computer-readable storage media having instructions stored thereon that, when executed by one or more processors, cause the one or more processors to identify a building asset within a digital representation of a building having one or more parameters describing relationships of the building asset within the building, control one or more other building assets included within the digital representation to change an environmental parameter of the building, monitor a response of at least one of the building asset or one of the one or more other building assets to the change in the environmental parameter, generate a parameter for the digital representation associated with the building asset based on the monitoring, and update the digital representation using the parameter.

In various embodiments, the parameter describes a confidence level in a validity of one of the one or more parameters. In various embodiments, the one or more processors are further configured to update at least one of the one or more parameters using the parameter. In various embodiments, generating the parameter includes analyzing a covariance between sensor measurements of the one or more other building assets associated with the change in the environmental parameter of the building. In various embodiments, the digital representation includes a graph data structure and wherein the one or more processors are further configured to update one or more portions of the graph data structure to represent a relationship of the building asset. In various embodiments, the digital representation includes a graph data structure and wherein the one or more processors are further configured to compare versions of the graph data structure representing at least a portion of the building to identify changes between the versions. In various embodiments, identifying the building asset includes selecting an asset based on an identified change between the versions of the graph data structure.

Another implementation of the present disclosure is a building management system (BMS) comprising a processing circuit including a processor and memory, the memory having instructions stored thereon that, when executed by the processor, cause the processing circuit to identify a building asset within a digital representation of a building having one or more parameters describing relationships of the building asset within the building, control one or more other building assets included within the digital representation to change an environmental parameter of the building, monitor a response of at least one of the building asset or one of the one or more other building assets to the change in the environmental parameter, generate a parameter for the digital representation associated with the building asset based on the monitoring, and update the digital representation using the parameter.

In various embodiments, the parameter describes a confidence level in a validity of one of the one or more parameters. In various embodiments, the processing circuit is further configured to update at least one of the one or more parameters using the parameter. In various embodiments, generating the parameter includes analyzing a covariance between sensor measurements of the one or more other building assets associated with the change in the environmental parameter of the building. In various embodiments, the digital representation includes a graph data structure and wherein the processing circuit is further configured to update one or more portions of the graph data structure to represent a relationship of the building asset. In various embodiments, the digital representation includes a graph data structure and wherein the processing circuit is further configured to compare versions of the graph data structure representing at least a portion of the building to identify changes between the versions, and wherein identifying the building asset includes selecting an asset based on an identified change between the versions of the graph data structure.

Another implementation of the present disclosure is a method for generating a graph data structure comprising receiving, by one or more processors, data associated with a building, generating one or more space nodes in the graph data structure corresponding to spaces within the building based on the data, generating one or more asset nodes in the graph data structure corresponding to assets within the building based on the data, associating sensor data with the one or more asset nodes based on the data, classifying the sensor data based on the data, and generating a relationship between at least two of the one or more space nodes, the one or more asset nodes, and the classified sensor data.

In various embodiments, the data includes building information model (BIM) data. In various embodiments, generating the one or more space nodes includes extracting an identifier from the data associated with the building and storing the identifier with at least one of the one or more spaces nodes. In various embodiments, generating the one or more asset nodes includes extracting an identifier from the data associated with the building and storing the identifier with at least one of the one or more asset nodes. In various embodiments, associating the sensor data with the one or more asset nodes includes dynamically controlling an environmental variable of the building, monitoring sensor measurements, and associating the sensor data based on the monitoring. In various embodiments, classifying the sensor data includes assigning a tag to the sensor data wherein the tag is associated with at least one of a source of the sensor data or a purpose of the sensor data. In various embodiments, the data includes string values and wherein generating the relationship includes parsing the string values to identify a semantic representation associating at least two of a space of the spaces, an asset of the assets, and a value of the classified sensor data. In various embodiments, associating the sensor data with the one or more asset nodes includes generating one or more data nodes and linking the one or more data nodes with at least one of the one or more asset nodes.

Another implementation of the present disclosure is one or more non-transitory computer-readable storage media having instructions stored thereon that, when executed by one or more processors, cause the one or more processors to receive data associated with a building, generate one or more space nodes in a graph data structure corresponding to spaces within the building based on the data, generate one or more asset nodes in the graph data structure corresponding to assets within the building based on the data, associate sensor data with the one or more asset nodes based on the data, classify the sensor data based on the data, and generate a relationship between at least two of the one or more space nodes, the one or more asset nodes, and the classified sensor data.

In various embodiments, the data includes building information model (BIM) data. In various embodiments, generating the one or more space nodes includes extracting an identifier from the data associated with the building and storing the identifier with at least one of the one or more spaces nodes. In various embodiments, generating the one or more asset nodes includes extracting an identifier from the data associated with the building and storing the identifier with at least one of the one or more asset nodes. In various embodiments, associating the sensor data with the one or more asset nodes includes dynamically controlling an environmental variable of the building, monitoring sensor measurements, and associating the sensor data based on the monitoring. In various embodiments, classifying the sensor data includes assigning a tag to the sensor data wherein the tag is associated with at least one of a source of the sensor data or a purpose of the sensor data. In various embodiments, the data includes string values and wherein generating the relationship includes parsing the string values to identify a semantic representation associating at least two of a space of the spaces, an asset of the assets, and a value of the classified sensor data. In various embodiments, associating the sensor data with the one or more asset nodes includes generating one or more data nodes and linking the one or more data nodes with at least one of the one or more asset nodes.

Another implementation of the present disclosure is a system for generating a graph data structure comprising a processing circuit including a processor and memory, the memory having instructions stored thereon that, when executed by the processor, cause the processing circuit to receive data associated with a building, generate one or more space nodes in the graph data structure corresponding to spaces within the building based on the data, generate one or more asset nodes in the graph data structure corresponding to assets within the building based on the data, associate sensor data with the one or more asset nodes based on the data, classify the sensor data based on the data, and generate a relationship between at least two of the one or more space nodes, the one or more asset nodes, and the classified sensor data.

In various embodiments, the data includes building information model (BIM) data. In various embodiments, generating the one or more space nodes includes extracting an identifier from the data associated with the building and storing the identifier with at least one of the one or more spaces nodes. In various embodiments, classifying the sensor data includes assigning a tag to the sensor data wherein the tag is associated with at least one of a source of the sensor data or a purpose of the sensor data.

Another implementation of the present disclosure is a method for augmenting a building model comprising receiving a first building model associated with at least a portion of a building and having a first format, receiving a second building modeling associated with the portion of the building and having a second format, comparing the first building model to the second building model to identify at least one element in the first building model not included in the second building model, and updating the second building model to include the identified at least one element.

In various embodiments, the second building model is a building information management (BIM) model. In various embodiments, the second format is an industry foundation classes (IFC) file format. In various embodiments, the first format is a first version of a building model and the second format is a second version of the building model and wherein updating the second building model to include the identified at least one element includes updating the second version of the building model with information from the first version of the building model. In various embodiments, updating the second building model includes generating one or more data objects within the second building model according to the second format. In various embodiments, updating the second building model includes translating information from the first format of the first building model into the second format of the second building model. In various embodiments, updating the second building model includes adding an identifier from the first building model to the second building model.

Another implementation of the present disclosure is one or more non-transitory computer-readable storage media having instructions stored thereon that, when executed by one or more processors, cause the one or more processors to receive a first building model associated with at least a portion of a building and having a first format, receive a second building modeling associated with the portion of the building and having a second format, compare the first building model to the second building model to identify at least one element in the first building model not included in the second building model, and update the second building model to include the identified at least one element.

In various embodiments, the second building model is a building information management (BIM) model. In various embodiments, the second format is an industry foundation classes (IFC) file format. In various embodiments, the first format is a first version of a building model and the second format is a second version of the building model and wherein updating the second building model to include the identified at least one element includes updating the second version of the building model with information from the first version of the building model. In various embodiments, updating the second building model includes generating one or more data objects within the second building model according to the second format. In various embodiments, updating the second building model includes translating information from the first format of the first building model into the second format of the second building model. In various embodiments, updating the second building model includes adding an identifier from the first building model to the second building model.

Another implementation of the present disclosure is a system for augmenting a building model comprising a processing circuit including a processor and memory, the memory having instructions stored thereon that, when executed by the processor, cause the processing circuit to receive a first building model associated with at least a portion of a building and having a first format, receive a second building modeling associated with the portion of the building and having a second format, compare the first building model to the second building model to identify at least one element in the first building model not included in the second building model, and update the second building model to include the identified at least one element.

In various embodiments, the second building model is a building information management (BIM) model. In various embodiments, the second format is an industry foundation classes (IFC) file format. In various embodiments, the first format is a first version of a building model and the second format is a second version of the building model and wherein updating the second building model to include the identified at least one element includes updating the second version of the building model with information from the first version of the building model. In various embodiments, updating the second building model includes generating one or more data objects within the second building model according to the second format. In various embodiments, updating the second building model includes translating information from the first format of the first building model into the second format of the second building model.

BRIEF DESCRIPTION OF THE DRAWINGS

The above and other aspects and features of the present disclosure will become more apparent to those skilled in the art from the following detailed description of the example embodiments with reference to the accompanying drawings, in which:

FIGS. 6A-B is a diagram illustrating input string manipulation, according to some exemplary embodiments;

DETAILED DESCRIPTION

Figure 1A:
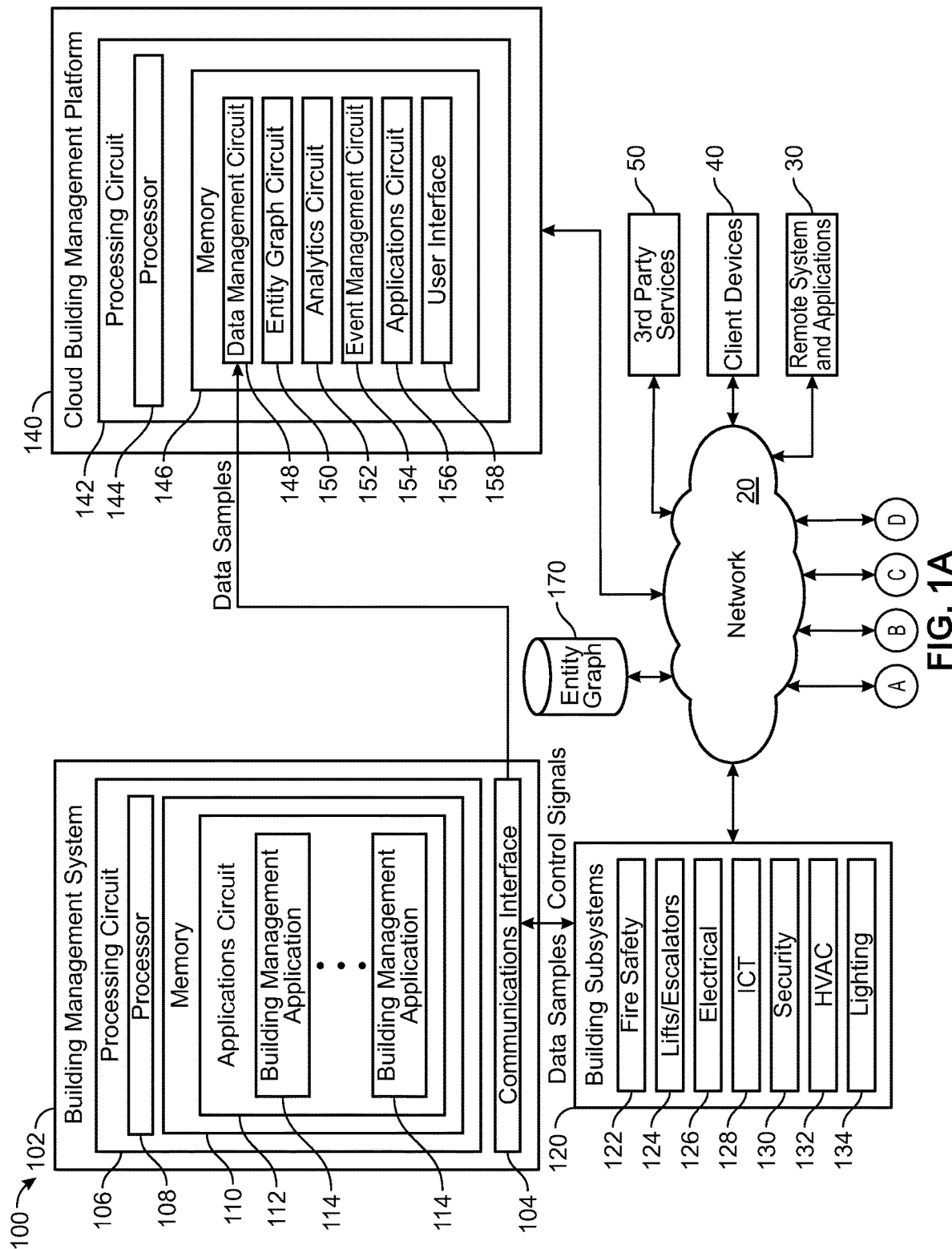
FIG. 1A is a block diagram of a smart building environment, according to an exemplary embodiment.

Hereinafter, example embodiments will be described in more detail with reference to the accompanying drawings.

In various embodiments, building management platforms such as a building management system includes digital representations of physical spaces. For example, a building management system may include a digital twin of a building that represents the people, places, assets, and events within the building. In various embodiments, digital twins are generated during the construction of a building. For example, an architect may generate a building information model (BIM) that is used by builders to construct a building and service personnel to maintain the building. Additionally or alternatively, digital representations such as digital twins may be generated for existing buildings. For example, a building management system of an existing building may generate a digital representation of the building. However, it may be difficult to generate a digital representation of a building (new, existing, or otherwise). For example, manually identifying the assets in a building may be difficult and time consuming. As a further example, some sources of existing building data may not be easily translatable to a digital representation and may require manual transfer. Further, configuring the devices of the buildings/spaces to work properly with one another and with the building management system can be difficult and time-consuming as well. In general, it may be desirable to avoid manually generating digital representations of buildings (e.g., to reduce input errors, because of the amount of data to be input, etc.). Therefore, systems and methods of self-configuring and commissioning spaces are needed. Specifically, system and methods to facilitate ingesting building data, generating a digital representation, and deriving new information based on the digital representation are needed. Virtual representations, digital representations, smart entities, and digital twins are used interchangeably in the present disclosure; in other words, where the present disclosure refers to virtual representations or smart entities, it should be understood that the features discussed could be implemented using digital twins or any other digital counterpart (e.g., updated in real-time, near real-time, periodically, in response to events, or in any other fashion). Additionally, in various embodiments, the systems and methods of the present disclosure can utilize digital twins for higher-level entities (e.g., such as buildings or campuses that include or are otherwise related to particular spaces, assets such as building equipment, people, and/or events) and/or for lower-level entities, such as digital twins of particular spaces (e.g., rooms, floors, etc.), people, assets (e.g., particular pieces of building equipment or groups of building equipment), and events. All such implementations are contemplated within the scope of the present disclosure.

One solution may include a smart configuration and commissioning system. The smart configuration and commissioning system may automate the process of generating and deploying a digital representation of a building, thereby reducing or eliminating a need for manual intervention. In various embodiments, the smart configuration and commissioning system may ingest and interpret external data sources (e.g., BIM data, enterprise management data, personnel data, etc.), extract semantic information from external data sources, dynamically determine configuration information, automatically enrich digital representations with derived information, and/or generate digital representations for spaces. In some implementations, the digital representations may be used to configuration and/or control of the building equipment and/or other assets contained in the buildings/spaces, and may significantly lower the time and expense of commissioning and configuring new buildings and spaces.

Figure 1B:
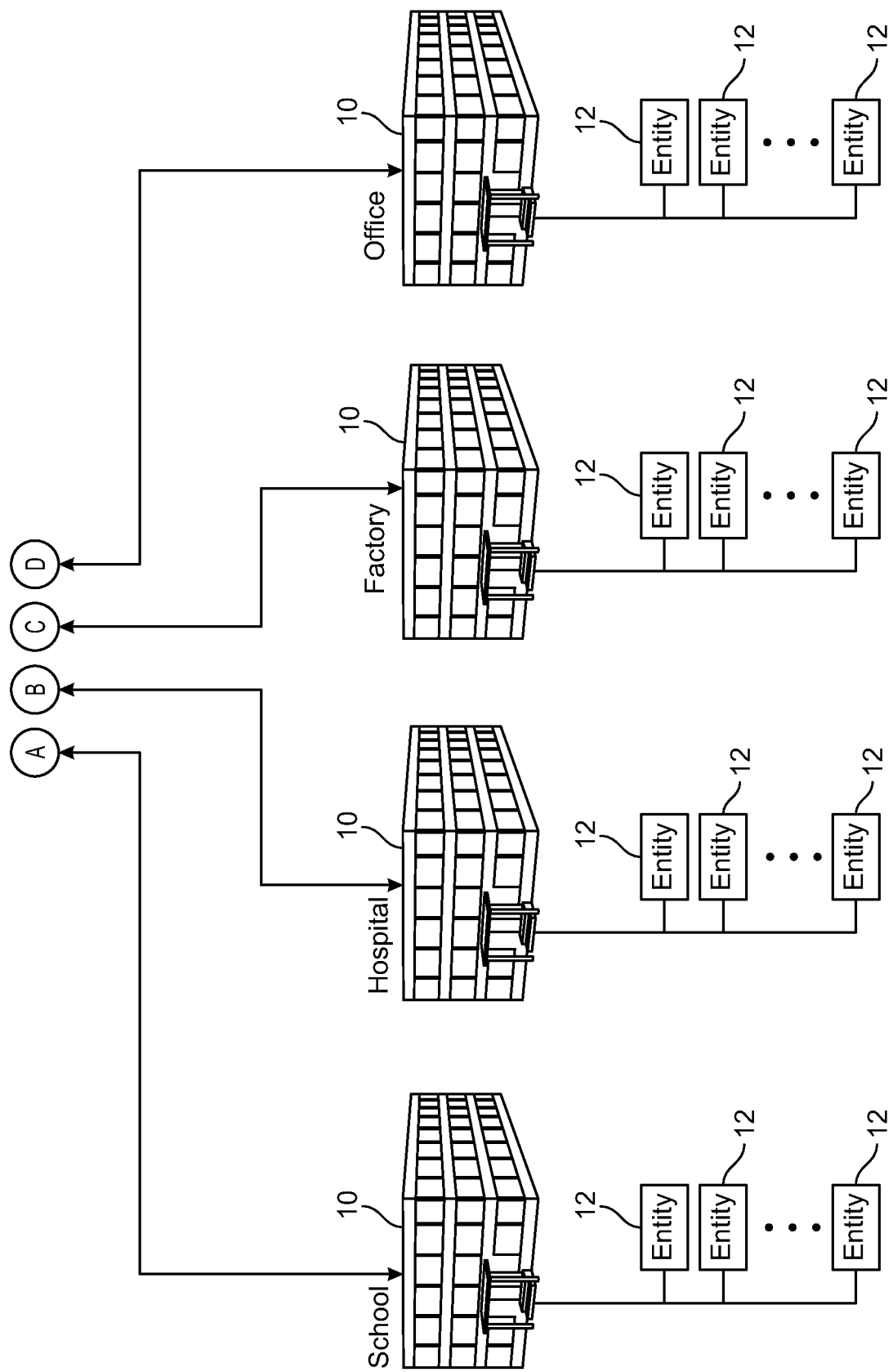
FIG. 1B is another block diagram of the smart building environment of FIG. 1A, according to an exemplary embodiment.

Referring now to FIGS. 1A-1B, a block diagram of a smart building environment 100 is shown, according to an exemplary embodiment. Smart building environment 100 is shown to include cloud building management platform 140. Cloud building management platform 140 may be configured to collect information from a variety of different data sources. Cloud management platform 140 may create digital representations, referred to as "digital twins," of physical spaces, equipment, people, and/or events based on the collected information. In various embodiments, the digital representations are stored in an entity graph. In brief overview, an entity graph is a data structure representing entities (e.g., spaces, equipment, people, events, etc.) and relationships between the entities. In various embodiments, the entity graph data structure facilitates advanced artificial intelligence and machine learning associated with the entities. In various embodiments, entities within the entity graph data structure include or are associated with "agents," or software entities configured to take actions with respect to the digital twins/real world entities with which they are associated. In some implementations, the agents may be configured to implement artificial intelligence/machine learning methodologies. The agents may be configured to facilitate communication and collection of information between the variety of different data sources. Each of the data sources may be implemented as, include, or otherwise use respective agents for facilitating communication amongst or between the data sources and cloud building management platform 140.

In various embodiments, cloud building management platform 140 collects data from buildings 10. For example, cloud building management platform 140 may collect data from buildings 10 such as a school, a hospital, a factory, an office building, and/or the like. It should be understood that the present disclosure is not limited to the number or types of buildings 10 shown in FIG. 1B. As new devices/components/spaces/buildings/events/control loops are added or otherwise incorporated into smart building environment 100, new digital representations (and associated agents, etc.) may be dynamically generated and incorporated into the entity graph data structure.

Buildings 10 may include entities 12. Entities 12 may include spaces, equipment, people, and/or events. In some embodiments, entities 12 include spaces such as floors, rooms, zones, campuses, buildings, and the like. In some embodiments, entities 12 include people such as employees, visitors, pedestrians, staff, and the like. In some embodiments, entities 12 include equipment such as inventory, assets, furniture, vehicles, building components, devices, and the like. For example, entities 12 may include devices such as internet of things (IoT) devices. IoT devices may include any of a variety of physical devices, sensors, actuators, electronics, vehicles, home appliances, and/or other items capable of communicating data over an electronic network (e.g., smart lights, smart appliances, smart home hub devices, etc.). In some embodiments, entities 12 include events such as meetings, fault indications, alarms, and the like. In various embodiments, cloud building management platform 140 receives information associated with buildings 10 and/or entities 12 and generates entity graph 170 based on the received information. Entity graph 170 may include digital twins that are digital representations of real world spaces, equipment, people, events, and/or the like. Entity graph 170 is described in greater detail below with reference to FIG. 2A-2B.

Smart building environment 100 may include building management system (BMS) 102. In various embodiments, BMS 102 communicates with cloud building management platform 140 to facilitate management and control of buildings 10 and/or the various operations described herein. BMS 102 may be configured to control, monitor, and/or manage equipment in or around a building or building area (e.g., such as buildings 10, etc.). For example, BMS 102 may include a HVAC system, a security system, a lighting system, a fire alerting system, and any other system that is capable of managing building functions or devices, or any combination thereof. Further, each of the systems may include sensors and other devices (e.g., IoT devices) for the proper operation, maintenance, monitoring, and the like of the respective systems. In some embodiments, each of buildings 10 is associated with a BMS 102. Additionally or alternatively, a single BMS 102 may manage multiple buildings 10. For example, a first BMS 102 may manage a first building 10, a second BMS 102 may manage a second building 10, and a third BMS 102 may manage the first and second buildings 10 (e.g., via the first and second BMS 102, in a master-slave configuration, etc.), as well as a third building 10. In various embodiments, BMS 102 communicates with building subsystems 120.

Building subsystems 120 may include fire safety subsystem 122, lift/escalators subsystem 124, building electrical subsystem 126, information communication technology (ICT) subsystem 128, security subsystem 130, HVAC subsystem 132, and/or lighting subsystem 134. In various embodiments, building subsystems 120 include fewer, additional, or alternative subsystems. For example, building subsystems 120 may additionally or alternatively include a refrigeration subsystem, an advertising or signage subsystem, a cooking subsystem, a vending subsystem, a printer or copy service subsystem, or any other type of building subsystem that uses controllable equipment and/or sensors to monitor or control a building 10. In some embodiment each of buildings 10 includes building subsystems 120. Additionally or alternatively, multiple buildings 10 may share at least some of building subsystems 120.

Each of building subsystems 120 may include any number of devices (e.g., IoT devices), sensors, controllers, and connections to facilitate functions and control activities. For example, HVAC subsystem 132 may include a chiller, a boiler, any number of air handling units, economizers, field controllers, supervisory controllers, actuators, temperature sensors, and other devices for controlling the temperature, humidity, airflow, or other variable conditions within buildings 10. Lighting subsystem 134 may include any number of light fixtures, ballasts, lighting sensors, dimmers, or other devices configured to controllably adjust the amount of light provided to a building space. Security subsystem 130 may include occupancy sensors, video surveillance cameras, digital video recorders, video processing servers, intrusion detection devices, access control devices and servers, or other security-related devices.

Cloud building management platform 140 and/or BMS 102 may interact with a variety of external systems. For example, cloud building management platform 140 may interact with remote systems and applications 30, client devices 40, and/or third party services 50. In various embodiments, systems and/or components of smart building environment 100 are configured to communicate using network 20. Network 20 may include hardware, software, or any combination thereof.

BMS 102 is shown to include communications interface 104 and processing circuit 106. Communications interface 104 may facilitate communications between BMS 102 and external systems/applications (e.g., cloud building management platform 140, remote systems and applications 30, client devices 40, third party services 50, building subsystems 120, etc.). Communications interface 104 may be or include wired or wireless communications interfaces (e.g., jacks, antennas, transmitters, receivers, transceivers, wire terminals, etc.) for conducting data communications within smart building environment 100 and/or with other external systems or devices. In various embodiments, communications via communications interface 104 is direct (e.g., local wired or wireless communications). Additionally or alternatively, communications via communications interface 104 may be via network 20 (e.g., a WAN, the Internet, a cellular network, etc.). For example, cloud building management platform 140 may communicate with BMS 102 using a wired connection and may communicate with client devices 40 (e.g., via BMS 102, etc.) using a cellular connection (e.g., a 4G or 5G access point/small cell base station, etc.). As a further example, communications interface 104 may include an Ethernet card and port for sending and receiving data via an Ethernet-based communications link or network. As a further example, communications interface 104 may include a Wi-Fi transceiver for communicating via a wireless communications network. As yet a further example, communications interface 104 may include cellular or mobile phone communications transceivers.

Processing circuit 106 may include processor 108 and memory 110. Processing circuit 106 may be communicably connected to communications interface 104 such that processing circuit 106 and the various components thereof can send and receive data via communications interface 104. Processor 108 may be implemented as a general purpose processor, an application specific integrated circuit (ASIC), one or more field programmable gate arrays (FPGAs), a group of processing components, or other suitable electronic processing components.

Memory 110 (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present application. Memory 110 may be or include volatile memory or non-volatile memory. Memory 110 may include database components, object code components, script components, or any other type of information structure for supporting the various activities and information structures described in the present application. According to some embodiments, memory 110 is communicably connected to processor 108 via processing circuit 106 and includes computer code for executing (e.g., by processing circuit 106 and/or processor 108) one or more of the operations described herein.

In some embodiments, BMS 102 and/or cloud building management platform 140 are implemented within a single computer (e.g., one server, one housing, etc.). In various other embodiments BMS 102 and/or cloud building management platform 140 are distributed across multiple servers or computers (e.g., that can exist in distributed locations). In some embodiments, functions of BMS 102 and/or cloud building management platform 140 are implemented as agents. For example, BMS 102 may include a fault detection agent configured to analyze building data and detect faults associated with building components.

Memory 110 may include applications circuit 112 that may include building management application(s) 114. Building management application(s) 114 may include various systems to monitor and/or control specific processes/events within buildings 10. For example, building management application(s) 114 may include automated measurement and validation (AM&V), demand response (DR), fault detection and diagnostics (FDD), integrated control systems, and/or a building subsystem integration system. Building management application(s) 114 may be configured to receive inputs from building subsystems 120 and/or other data sources, determine improved and/or optimal control actions for building subsystems 120 based on the inputs, generate control signals based on the improved and/or optimal control actions, and provide the generated control signals to building subsystems 120.

Cloud building management platform 140 is shown to include processing circuit 142 having processor 144 and memory 146. In some embodiments, cloud building management platform 140 includes multiple processing circuits 142 each having one or more processors 144 and/or memories 146. Processor 144 may be a general purpose or specific purpose processor, an application specific integrated circuit (ASIC), one or more field programmable gate arrays (FP- GAs), a group of processing components, or other suitable processing components. Processor 144 may be configured to execute computer code or instructions stored in memory 146 or received from other computer readable media (e.g., CDROM, network storage, a remote server, etc.).

Memory 146 may include one or more devices (e.g., memory units, memory devices, storage devices, etc.) for storing data and/or computer code for completing and/or facilitating the various processes described in the present disclosure. Memory 146 may include random access memory (RAM), read-only memory (ROM), hard drive storage, temporary storage, non-volatile memory, flash memory, optical memory, or any other suitable memory for storing software objects and/or computer instructions. Memory 146 may include database components, object code components, script components, or any other type of information structure for supporting the various activities and information structures described in the present disclosure. According to some embodiments, memory 146 is communicably connected to processor 144 via processing circuit 142 and includes computer code for executing (e.g., by processing circuit 142 and/or processor 144) one or more of the operations described herein.

Memory 146 may include data management circuit 148, entity graph circuit 150, analytics circuit 152, event management circuit 154, applications circuit 156, and/or user interface circuit 158. Data management circuit 148 may be configured to collect, manage, and/or retrieve data. In various embodiments, data management circuit 148 receives data samples from buildings 10 (e.g., via BMS 102, directly, etc.) and stores the data samples in structured storage. For example, the data samples may include data values for various data points. The data values may be measured and/or calculated values, depending on the type of data point. For example, a data point received from a temperature sensor may include a measured data value indicating a temperature measured by the temperature sensor. Data management circuit 148 may receive data samples from systems, components, and/or devices (e.g., IoT devices, sensors, etc.) within smart building environment 100 (e.g., remote systems and applications 30, client devices 40, third party services 50, BMS 102, building subsystems 120, etc.) and/or from external systems (e.g., the Internet, etc.). For example, data management circuit 148 may receive timeseries data from an occupancy sensor associated with one of buildings 10 and facilitate storage of the timeseries data in structured storage (e.g., in entity graph 170, etc.). As a further example, data management circuit 148 may receive an electronic calendar event (e.g., a meeting invitation, etc.) from one of client devices 40 and facilitate storage of the electronic calendar event in structure storage (e.g., in entity graph 170, etc.). In some embodiments, data management circuit 148 uses or retrieves an entity graph (e.g., via entity graph circuit 150, etc.) when organizing received data.

Entity graph circuit 150 may be configured to manage entity graph 170. In various embodiments, entity graph circuit 150 registers and manages various buildings (e.g., building 10, etc.), spaces, persons, subsystems (e.g., building subsystems 120, etc.), devices (e.g., IoT devices, etc.), events, and/or other entities in cloud building management platform 140. As described above, an entity may be any person, place, space, physical object, equipment, or the like. Further, an entity may be any event, data point, record structure, or the like. Entities and entity graph 170 are described in detail below with reference to FIGS. 2A-2B.

Analytics circuit 152 may be configured to analyze data to generate results. For example, analytics circuit 152 may analyze sensor data (e.g., weight measurements, image data, audio data, etc.) from a building lobby to identify a user. As a further example, analytics circuit 152 may apply fault detection rules to timeseries data from an HVAC system to detect a fault associated with the HVAC system. In various embodiments, analytics circuit 152 performs operations on information stored in entity graph 170. For example, analytics circuit 152 may traverse entity graph 170 to retrieve context information (e.g., energy usage, event activity, occupancy sensor data, HVAC control schedules, etc.) associated with one of buildings 10, and analyze the context information to determine a user schedule associated with the building (e.g., when the building is most heavily in use, etc.).

Event management circuit 154 may be configured to generate actions. For example, event management circuit 154 may receive event data from building subsystems 120 (e.g., a security alarm, etc.), and generate a response based on the event data (e.g., cause BMS 102 to sound an alarm, etc.). In various embodiments, event management circuit 154 generates actions dynamically. For example, event management circuit 154 may include artificially intelligent agents configured to generate actions in real-time based on received input. For example, event management circuit 154 may include an AI agent that dynamically generates a notification to an interested party in response to receiving an indication of an identified individual. As a further example, event management circuit 154 may receive a prediction from analytics circuit 152 that a building component is about to enter a fault state and may dynamically generate a work order ticket for the building component in response to the received prediction.

Applications circuit 156 may be configured to facilitate a variety of applications associated with cloud building management platform 140. For example, applications circuit 156 may facilitate a smart messaging system, a personal comfort system, a health and wellness system, a smart parking lot system, a smart signage system, a smart lobby system, a smart meeting room system, an employee productivity system, and/or the like. In various embodiments, applications circuit 156 facilitates operation of various systems that integrate with smart building environment 100. For example, applications circuit 156 may facilitate a FDD system that receives data from buildings 10 and generates fault indications associated with buildings 10.

User interface 158 may be configured to facilitate user interaction with cloud building management platform 140 and/or BMS 102. For example, a user may update personalized preferences associated with operation of cloud building management platform 140 via user interface 158. In some embodiments, user interface 158 facilitates dynamic feedback (e.g., a natural user interface, etc). For example, user interface 158 may facilitate chatbot interaction, voice commands, user authentication, biometric feedback, or the like.

Figure 2A:
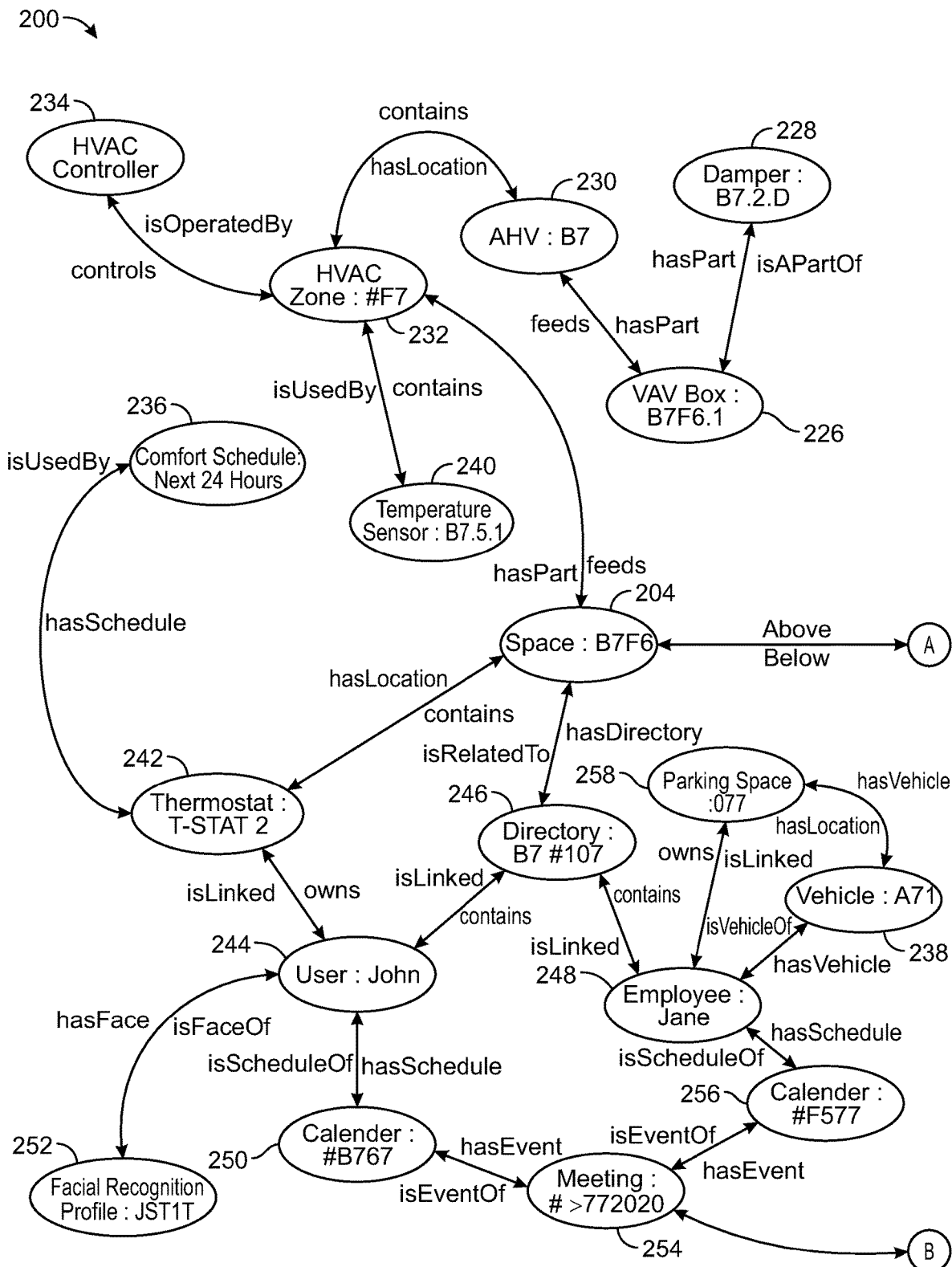
FIG. 2A is a block diagram of an entity graph, according to an exemplary embodiment.
Figure 2B:
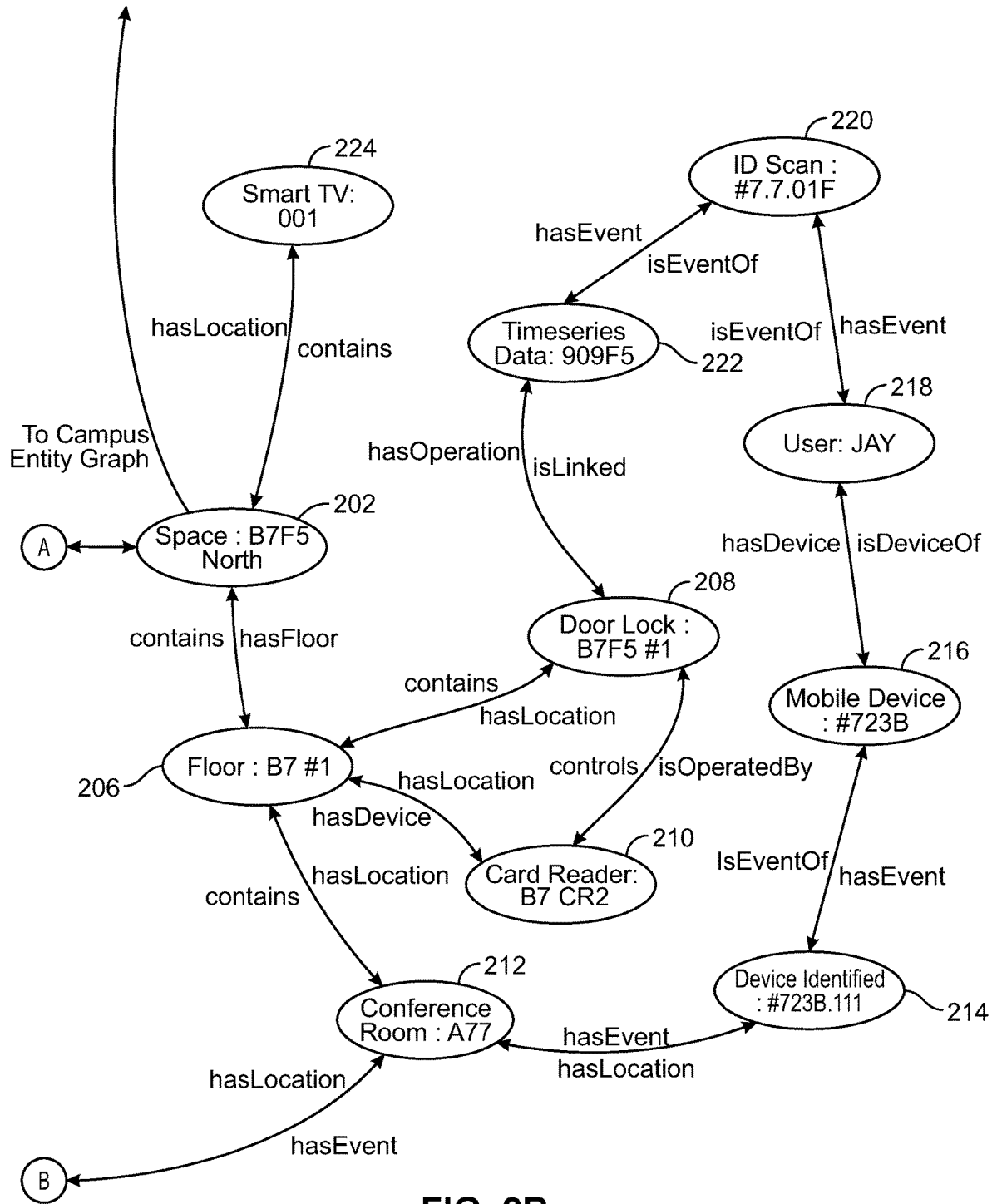
FIG. 2B is another block diagram of the entity graph of FIG. 2A, according to an exemplary embodiment.

Referring now to FIGS. 2A-2B, an entity graph 200 is shown in greater detail, according to an exemplary embodiment. In brief overview, entity graphs such as entity graph 170 and/or entity graph 200 are structured data stored in memory (e.g., a database, memory 146, etc.). Entity graphs such as entity graph 200 and/or entity graph 170 may include digital twins. Digital twins may be digital representations of real world spaces, equipment, people, and/or events. In various embodiments, digital twins represent buildings, building equipment, people associated with buildings, and/or events associated with buildings (e.g., buildings 10, etc.). An entity graph may include nodes and edges, where each node of the entity graph represents an entity and each edge is directed (e.g., from a first node to a second node) and represents a relationship between entities (e.g., indicates that the entity represented by the first node has a particular relationship with the entity represented by the second node). For example, an entity graph may be used to represent a digital twin of a person.

Entities can be things and/or concepts related to spaces, people, and/or asset. For example, the entities could be "B7F4 North", "Air Handling Unit," and/or "meeting room." The nodes can represent nouns while the edges can represent verbs. For example, the edges can be "isA," "hasPart," and/or "feeds." In various embodiments, the edges represent relationships. While the nodes represent the building and its components, the edges describe how the building operates. The nodes and edges together create a digital twin of a particular building. In some embodiments, the entities include properties or attributes describing the entities (e.g., a thermostat may have a particular model number attribute). The components of the entity graph form large networks that encode semantic information for a building.

The entity graph is configured to enable flexible data modeling for advanced analytics, control, and/or artificial intelligence applications, in some embodiments. These applications may require, or benefit from information modeling including interconnected entities. Other data modeling techniques based on a table, a hierarchy, a document, and/or a relational database may not be applicable. The entity graph can be a foundational knowledge management layer to support other higher level applications, which can be, complex root cause, impact analysis, building powerful recommendation engines, product taxonomy information services, etc. Such a multilayer system, a system of system topologies, can benefit from an underlying entity graph.

The entity graph can be a data contextualization layer for all traditional and/or artificial intelligence applications. The entity graph can be configured to capture evidence that can be used to attribute the strengths of entity relationships within the entity graph, providing the applications which utilize the entity graph with context of the systems they are operating. Without context (e.g., who the user is, what the user is looking for, what the target of a user request is, e.g., find a meeting room, increase a temperature in my office) these applications may never reach their full potential. Furthermore, the entity graph provides a native data structure for constructing question and answer type systems, e.g., a chatbot, that can leverage and understand intent.

In various embodiments, the entity graph includes data from various sources. For example, the entity graph may include data associated with people, places, assets, and/or the like. In various embodiments, the data source(s) represent a heterogenous source data schema such as an open source common data model (e.g., a Brick Schema/extensions, etc.).

In various embodiments, entity graph includes digital twins and/or context information. A digital twin is a digital representation of spaces, assets, people, events, and/or anything associated with a building or operation thereof. In various embodiments, digital twins are modeled in the entity graph. In various embodiments, digital twins include an active compute process. For example, a digital twin may communicate with other digital twins to sense, predict and act. In various embodiments, digital twins are generated dynamically. For example, a digital twin corresponding to a conference room may update its status by looking at occupancy sensors or an electronic calendar (e.g., to turn its status "available" if there is no show, etc.). In various embodiments, digital twins and/or the entity graph include context information. Context information may include real-time data and a historical record of each system in the environment (e.g., campus, building, facility, space, etc.). Context information may be stored in the entity graph. In various embodiments, context information facilitates flexible data modeling for advanced analytics and AI application in scenarios that model highly interconnected entities.

The entity graph may not be a configuration database but may be a dynamic representation of a space, person, event, and the like. The entity graph can include operational data from entities which it represents, e.g., sensors, actuators, card access systems, occupancy of a particular space, thermodynamics of the space as a result of actuation, etc. The entity graph can be configured to continually, and/or periodically, ingest new data of the space and thus the entity graph can represent a near real-time status of cyber-physical entities and their inter-relationships. For this reason, artificial intelligence can be configured to introduce a virtual entity and new semantic relationships among entities, in some embodiments.

The entity graph is configured to facilitate adaptive controls, in some embodiments. The entity graph can be configured to adapt and learn over time. The entity graph can be configured to enable dynamic relationships between building information and other facility and enterprise systems to create new insights and drive new optimization capabilities for artificial intelligence systems. As relationships can be learned over time for the entity graph, the artificial intelligence systems and also learn overtime based on the entity graph. Entity graphs (e.g., space graphs, etc.) are described in greater detail with reference to U.S. patent application Ser. No. 16/260,078, filed on Jan. 28, 2019, the entire disclosure of which is incorporated by reference herein.

Entity graph 200 includes entities 202-258 (stored as nodes within entity graph 200) describing spaces, equipment, events, and people (e.g., business employees, etc.). In various embodiments, entities 202-258 are associated with or otherwise include agents (e.g., agents may be assigned to/associated with entities, etc.). Additionally or alternatively, agents may be represented as nodes in entity graph 200 (e.g., agent entities, etc.). Furthermore, relationships are shown between entities 202-258 directionally describing relationships between two of entities 202-258 (stored as edges within entity graph 200). In various embodiments, cloud building management platform 140 may traverse entity graph 200 to retrieve a description of what types of actions to take for a certain device, what the current status of a room is (e.g., occupied or unoccupied), etc.

As an example, entity graph 200 illustrates an office space called "B7F5 North" of a building. A smart TV referred to as "Smart TV 001" has a directional relationship to the space referred to as "B7F5 North." The relationship may be an edge "hasLocation" indicating that the device (e.g., the smart TV represented by entity 224) has a location (e.g., the space represented by entity 202). Furthermore, a second edge "contains" from entity 202 to entity 224 indicates that the location (e.g., the space represented by entity 202) includes the device (e.g., the smart TV represented by entity 224). In some embodiments, entity graph circuit 150 generates the nodes of entity graph 200 from various data sources including a building automation system, a security system, a fire alarm, human resources system, and/or building information model (BIM) files (e.g., through an entity name matching process, etc.). Furthermore, semantic relationships may be extracted from the building information by entity graph circuit 150. In some embodiments, only a single relationship exists between entities. In some embodiments, nodes and edges are determined dynamically as building data that is received and ingested into entity graph 200. For example, cloud building management platform 140 is configured to identify a door lock and card reader and generate a number of nodes and edges in entity graph 200 representing the card reader controller operation of the door lock.

Smart Configuration and Commissioning System

Figure 3:
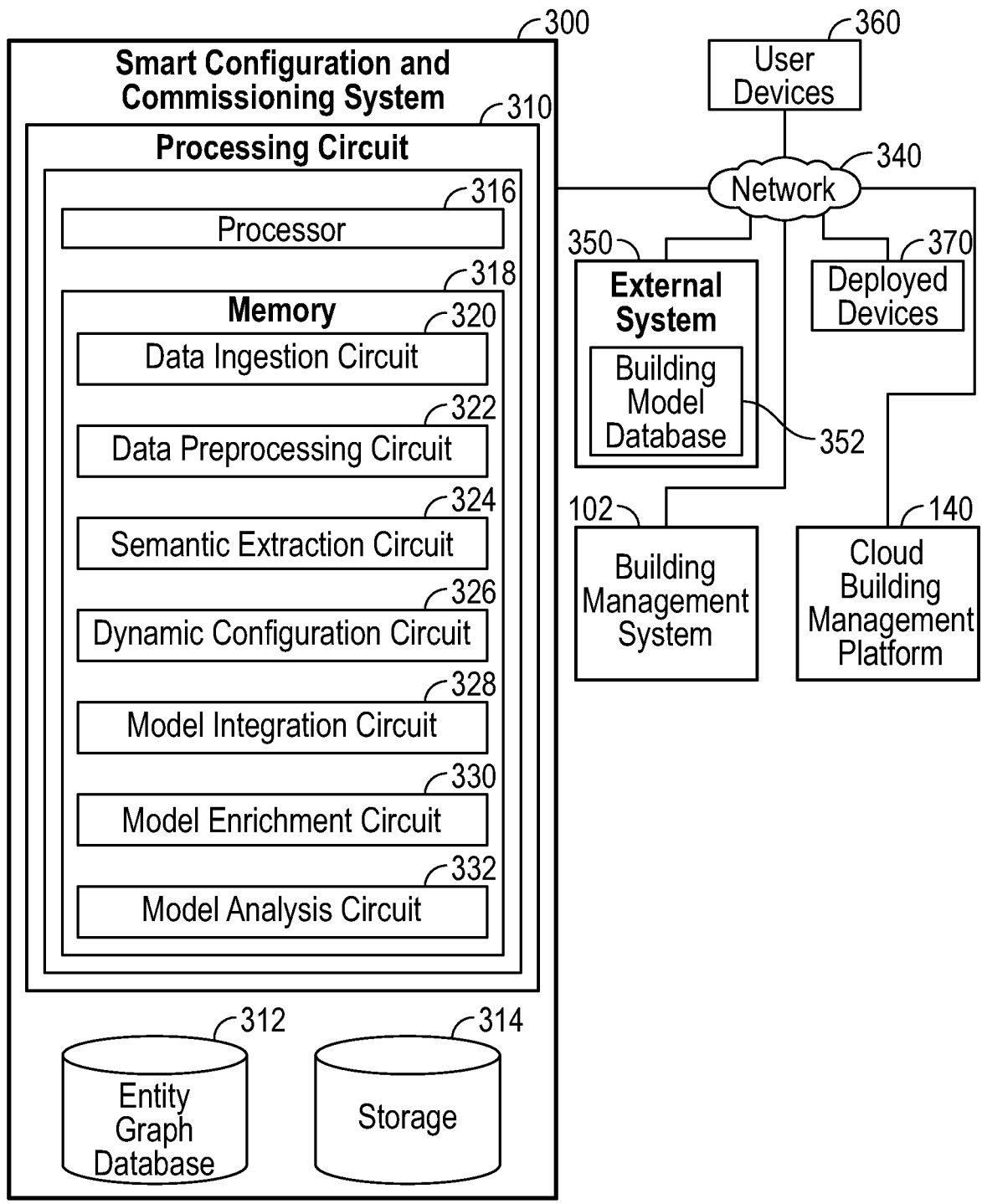
FIG. 3 is a block diagram illustrating a smart configuration and commissioning system, according to some exemplary embodiments.

Referring now to FIG. 3, smart configuration and commissioning system 300 is shown, according to an exemplary embodiment. Smart configuration and commissioning system 300 may automate a process of generating a digital representation of a space such as a building. In various embodiments, smart configuration and commissioning system 300 facilitates generating entity graph 170. Additionally or alternatively, smart configuration and commissioning system 300 may facilitate linking various models and/or subsystems. For example, smart configuration and commissioning system 300 may link a graph data structure to building subsystems such as mapping building spaces to an API of a lighting subsystem. In various embodiments, smart configuration and commissioning system 300 is configured to generate virtual environments for spaces. For example, smart configuration and commissioning system 300 may generate a floor plan, images of assets, spaces (e.g., from structured data such as a BIM model, etc.), 3D assets, and/or the like. In various implementations, smart configuration and commissioning system 300 communicates with various systems, databases, and/or the like over network 340. For example, smart configuration and commissioning system 300 may communicate with building management system 102, cloud building management platform 140, external system 350, user devices 360, and/or deployed device 370. Network 340 may include computer networks such as the Internet, local, wide, metro or other area networks, intranets, satellite networks, other computer networks such as voice or data mobile phone communication networks, combinations thereof, or any other type of electronic communications network. In various embodiments, network 340 facilitates secure communication between smart configuration and commissioning system 300 and other systems. As a non-limiting example, network 340 may implement transport layer security (TLS), secure sockets layer (SSL), hypertext transfer protocol secure (HTTPS), and/or any other secure communication protocol.

External systems 350 may be an external source of data for smart configuration and commissioning system 300. For example, external systems 350 may include a human-resources (HR) database, an email directory, a security system, a DHCP server, a lighting control system, a visitor registration system, a parking management system, and/or the like. External systems 350 may include one or more storage mediums. The storage mediums may include but are not limited to magnetic storage, optical storage, flash storage, and/or RAM. External systems 350 may implement or facilitate various APIs to perform database functions (i.e., managing data stored in external systems 350). The APIs can be but are not limited to SQL, ODBC, JDBC, and/or any other data storage and manipulation API.

In various embodiments, external systems 350 include building model database 352. Building model database 352 may include building models describing one or more buildings and/or spaces. For example, building model database 352 may include a BIM model, an IFC file, a Revit model, a csv file, a COBie file, an RDF graph model, a TTL file, an SVG file, and/or the like. In various embodiments, building model database 352 includes data to be integrated into a digital representation of a building such as entity graph 170. For example, smart configuration and commissioning system 300 may receive a csv file including building assets for a building and may ingest the building assets into a digital representation of the building.

User devices 360 may be a source of data for smart configuration and commissioning system 300. User devices 360 may include smartphones, tablets, handheld devices, scanners, and/or the like. In various embodiments, user devices 360 are configured to provide information to smart configuration and commissioning system 300 to be integrated into a digital representation of a building. For example, a smartphone may capture LIDAR data for a space within a building and smart configuration and commissioning system 300 may integrate the LIDAR data into a digital representation of the building (e.g., to facilitate modeling and/or viewing an interior of the space, etc.). In some embodiments, user devices 360 provide user feedback data. For example, smart configuration and commissioning system 300 may operate a fan that has not been mapped to a space within a building and may receive feedback (e.g., user feedback via user devices 360 and/or sensor feedback indicating that a specific room suddenly became cold) and may determine that the fan serves the specific room. Smart configuration and commissioning system 300 may receive image data, location data, 3D data, sound data, light data, distance measurements, surveyor data (e.g., cartographic information, etc.), user feedback, user input, temperature data, motion data, and/or the like from user devices 360.

Deployed devices 370 may be devices deployed within a space such as a building. In various embodiments, deployed devices 370 include device associated with a building management system. For example, deployed devices 370 may include dampers, chillers, door locks, AHUs, smart lights, controllers, and/or the like. In various embodiments, deployed devices 370 include specific sensors such as temperature sensors, occupancy sensors, humidity sensors, vibration sensors, glass-break sensors, weight sensors, flow sensors, IR sensors, cameras, and/or the like. In various embodiments, smart configuration and commissioning system 300 receives information from deployed devices 370 and integrates the information into a digital representation of a space such as a building. For example, smart configuration and commissioning system 300 may receive a scan from a building management system that may attempt to identify deployed devices 370 that are controlled by the building management system and may generate digital representations for the identified deployed devices 370. Additionally or alternatively, smart configuration and commissioning system 300 may turn on a smart light that has not been mapped to a space within a building, may receive an indication from a camera that a light turned on in a specific room, may determine that the smart light is located in the specific room, and may update a digital representation of the building to map the smart light to the specific room.

Smart configuration and commissioning system 300 is shown to include processing circuit 310, entity graph database 312, and storage 314. Processing circuit 310 may include processor 316 and memory 318. Memory 318 may have instructions stored thereon that, when executed by processor 316, cause processing circuit 310 to perform the various operations described herein. The operations described herein may be implemented using software, hardware, or a combination thereof. Processor 316 may include a microprocessor, ASIC, FPGA, etc., or combinations thereof. In many embodiments, processor 316 may be a multi-core processor or an array of processors. Memory 318 may include, but is not limited to, electronic, optical, magnetic, or any other storage devices capable of providing processor 316 with program instructions. Memory 318 may include a floppy disk, CD-ROM, DVD, magnetic disk, memory chip, ROM, RAM, EEPROM, EPROM, flash memory, optical media, or any other suitable memory from which processor 316 can read instructions. The instructions may include code from any suitable computer programming language such as, but not limited to, C, C++, C #, Java, JavaScript, Perl, HTML, XML, Python and Visual Basic. While the present features are described as being implemented using a processor and memory, it should be understood that, in various embodiments, the features could be implemented using any other type of computing or processing architecture, such as special-purpose integrated circuits. Further, in some implementations, processor 316 may include a system of multiple processors and/or memory 318 may include a system of multiple computer-readable storage media. For example, in some implementations, system 300 may be implemented using a distributed computing environment in which multiple computing systems work in a distributed or coordinating fashion to implement various functions described herein. In some such implementations, system 300 may be a cloud computing system in which computing cloud-based resources perform the functions. In various implementations, the functions can be performed by servers, client devices, or a combination thereof.

Memory 318 may include data ingestion circuit 320, data preprocessing circuit 322, semantic extraction circuit 324, dynamic configuration circuit 326, model integration circuit 328, model enrichment circuit 330, and model analysis circuit 332. Data ingestion circuit 320 may be configured to receive data from various sources (e.g., building management system 102, external systems 350, user devices 360, etc.) and ingest the data into a digital representation of a space. For example, data ingestion circuit 320 may receive a csv file having a listing of building assets and may generate object entities for entity graph 170 based on each of the building assets. As another example, data ingestion circuit 320 may receive images of an interior of a space from user devices 360 (e.g., smartphones, etc.) and may embed the images into a 3D model of the space. In various embodiments, data ingestion circuit 320 converts various input formats. For example, data ingestion circuit 320 may convert from serialized BIM to Brick RDF (e.g., a JSON-LD) model, etc.), from Revit to Forge, from Revit BIM to SVF, from COBie to Brick RDF, from SCT to Brick RDF, from RAC to Brick, from Excel to Brick, from an old version of a file format to a new version of a file format, from Revit (e.g., IFC, etc.) to GeoJson, from Revit to TTL, and/or the like. In various embodiments, data ingestion circuit 320 may generate digital representations of buildings, floors, rooms, spaces, zones (e.g., HVAC zones, etc.), and/or the like based on received data. Additionally or alternatively, data ingestion circuit 320 may generate digital representations of relationships between entities (e.g., buildings, floors, etc.) such as spatial relationships (e.g., buildings [hasLocation] Floor [hasLocation] Room [hasLocation] Equipment, Zone (HVAC) [hasPart] Space, etc.). In various embodiments, data ingestion circuit 320 may store point values (e.g., sensor readings, measurements, etc.) based on received data. For example, data ingestion circuit 320 may receive an excel file including temperature readings associated with a space over a period of time and may integrate the temperature readings into a digital representation of the space such as entity graph 170.

Data preprocessing circuit 322 may perform various functions of received data to facilitate ingesting the data into a digital representation. For example, data preprocessing circuit 322 may perform semantic extraction (e.g., via semantic extraction circuit 324, etc.) on input strings to identify descriptive information within the strings (e.g., building identifiers, zone identifiers, equipment identifiers, times, dates, locations, etc.). As another example, data preprocessing circuit 322 may perform various dataset manipulations such as transposing a matrix (e.g., to facilitate simplified data ingestion, etc.) and/or processing data such as determining whether a location of "Madison" associated with a building refers to Madison, WI or Madison, AL.

Semantic extraction circuit 324 may receive data and automatically (e.g., with little to no user intervention, etc.) extract semantic information from the data such as asset identifiers. For example, semantic extraction circuit 324 may receive a string and may analyze the string (e.g., parse the string) using machine learning (or artificial intelligence models such as a neural network, etc.) to extract one or more identifiers embedded within the string. For example, semantic extraction circuit 324 may receive the string "ZONE.AHU01.RM2008S.ZONE_AIR_TEMP" and may identify that the string relates to point data associated with an air temperature in a HVAC zone associated with room 2008S that is served by AHU01. As an additional example, semantic extraction circuit 324 may receive a string and may identify a space, a zone, a point type, and/or the like embedded in the string. In some embodiments, semantic extraction circuit 324 may extract classes and/or identifiers from strings. Semantic extraction from strings is discussed in detail in U.S. patent application Ser. No. 16/885,959 titled, "BUILDING SYSTEM WITH STRING MAPPING BASED ON A STATISTICAL MODEL" filed on May 28, 2020 and U.S. patent application Ser. No. 16/885,968 titled, "BUILDING SYSTEM WITH STRING MAPPING BASED ON A SEQUENCE TO SEQUENCE NEURAL NETWORK" filed on May 28, 2020, the entirety of both of which are incorporated by reference herein. In various embodiments, semantic extraction circuit 324 may extract semantic information from various sources. For example, semantic extraction circuit 324 may extract room names and/or dimensions from a SVG floorplan. In some embodiments, semantic extraction circuit 324 implements a hidden Markov Model (HMM). Additionally or alternatively, semantic extraction circuit 324 may implement a conditional random field (CRF) model. In various embodiments, semantic extraction circuit 324 generates recommendations for a user. For example, semantic extraction circuit 324 may generate semantic recommendations based on analyzing an input string. As another example, semantic extraction circuit 324 may receive the string "SDH_CHW2_CHP4_ALM" and may generate a recommendation that "SDH" is a building and "CHW" is either chilled water or cold water. In various embodiments, semantic extraction circuit 324 trains one or more models using training data. For example, semantic extraction circuit 324 may be trained on prelabeled strings (e.g., strings that a user has performed semantic extraction on, etc.). As an additional example, semantic extraction circuit 324 may be trained on entity names (e.g., point names, etc.). In various embodiments, semantic extraction circuit 324 augments one or more systems, such as OpenRefine (e.g., through one or more plugins or operators, etc.).

Dynamic configuration circuit 326 may modify operation of one or more devices and derive information therefrom. For example, dynamic configuration circuit 326 may turn on a fan associated with a known location within a building, may monitor one or more temperature sensors that have not been mapped to a location within the building, and may determine based on a change in temperature associated with one or more of the sensors that the one or more sensors are located in the location. In various embodiments, dynamic configuration circuit 326 is configured to fill gaps in a digital representation of a space. For example, a digital representation such as entity graph 170 may include a number of unlabeled/unassigned assets (e.g., smart lights not yet associated with a room, etc.) and dynamic configuration circuit 326 may derive the missing labels/assignments by operating various assets within a building (e.g., as described above, etc.). In various embodiments, dynamic configuration circuit 326 generates and/or modifies relationships within entity graph 170.

Model integration circuit 328 may integrate one or more models into a digital representation of a space. For example, model integration circuit 328 may receive a BIM associated with a building and may integrate information included in the BIM into a digital representation of the building (e.g., entity graph 170, etc.). In various embodiments, model integration circuit 328 extracts semantic information from data. For example, model integration circuit 328 may receive a simple vector format (SVF) file depicting a floorplan of a building and may extract dimensions of rooms in the floorplan from the SVF file and embed the dimensions in a digital representation of the building (e.g., entity graph 170, etc.). In various embodiments, model integration circuit 328 deduplicates between identifiers in various models. For example, a first model may include building data having an asset labeled with a first identifier and a second model may include building data having the asset labeled with a second identifier and model integration circuit 328 may determine that the first and second identifiers are associated with the same asset and may only generate a single instance of the first asset in a digital twin. In various embodiments, model integration circuit 328 uses machine learning and/or artificial intelligence to deduplicate between entities (e.g., asset identifiers, etc.).

In various embodiments, model integration circuit 328 may modify/enrich an existing model, such as a BIM, to become a digital twin of a building (e.g., use the BIM as entity graph 170 or change the BIM into entity graph 170, etc.). In various embodiments, model integration circuit 328 modifies existing models to include new information. For example, entity graph 170 may include more complete information than an imported BIM and model integration circuit 328 may modify the imported BIM to include the additional information included in entity graph 170. In various embodiments, model integration circuit 328 selects between versions of models. For example, model integration circuit 328 may prefer "central" BIM models if available but may also use "local" BIM models. In various embodiments, model integration circuit 328 resolves conflicts between various versions of models. For example, model integration circuit 328 may analyze two conflicting model versions to determine one or more aspects from each of the conflicting models that is most accurate and may ingest the one or more aspects.

In some embodiments, model integration circuit 328 augments one or more existing models. For example, model integration circuit 328 may link a COBie model with a graphical model using a unique identifier (e.g., a key, etc.). As another example, model integration circuit 328 may embed spatial metadata (e.g., floorplan dimensions, etc.) into a SVG floorplan. As yet another example, model integration circuit 328 may generate custom data within a model such as a BIM. For example, model integration circuit 328 may generate custom data (e.g., key/value pairs, etc.) and embed the custom data into a model such as a BIM to augment the model with more granular of data than would be natively possible. In various embodiments, model integration circuit 328 facilitates transferring augmentations between versions of models. For example, model integration circuit 328 may augment a first version of a BIM and may automatically augment (e.g., sync, etc.) a second version of the BIM when it is released. In various embodiments, model integration circuit 328 maintains a unique identifier for each model version. Additionally or alternatively, model integration circuit 328 may maintain unique identifiers for objects within a model. For example, model integration circuit 328 may generate a stable identifier for objects within a BIM model. As an additional example, model integration circuit 328 may generate global identifiers for objects within a model such as a BIM model and may automatically reapply the global identifiers to a subsequent version of the model. Global identifiers may facilitate performing operations across models (e.g., searching for an entity in entity graph 170 and/or a BIM model, etc.). In various embodiments, global identifiers are stored in a graph data structure (e.g., a digital twin of a space, entity graph 170, etc.). Therefore, a model such as a BIM model or a digital twin may display visual data such as a 3D model by retrieving a SVF model using the global identifier. In various embodiments, this solves existing problems associated with visualizing a space (e.g., in a web browser, etc.). In some embodiments, model integration circuit 328 facilitates serializing models. For example, model integration circuit 328 may serialize a BIM model.

Model enrichment circuit 330 may enrich an existing model using derived information. For example, model enrichment circuit 330 may enrich a digital representation of a building (e.g., entity graph 170, etc.) with information derived from the digital representation. In some embodiments, model enrichment circuit 330 generates a health metric associated with data. For example, model enrichment circuit 330 may operate an HVAC unit associated with a space, monitor the temperature in the space with a number of temperature sensors, and based on determining that one of the number of temperature sensors deviated from the rest of the number of temperature sensors may determine that either (i) the one temperature sensor is malfunctioning (e.g., needs to be repaired, etc.) or (ii) the one temperature sensor is not actually located in the space. To continue the previous example, based on the determination, model enrichment circuit 330 may modify point values (e.g., sensor readings, etc.) associated with the one temperature sensor to include a health metric that indicates that the "health" of the data (e.g., the validity, the trustworthiness, etc.) is in question. In various embodiments, systems (e.g., building management system 102, etc.) may use such health metrics during analysis and operation (e.g., discount sensor readings from sensors having health metrics that indicate their data may be untrustworthy, etc.). In various embodiments, model enrichment circuit 330 may derive information from existing data such as determining floorplan dimensions from a SVG floorplan.

In some embodiments, model enrichment circuit 330 enriches a digital representation of a space (e.g., a graph data structure, entity graph 170, etc.) with visualization data. For example, model enrichment circuit 330 may link 2D and/or 3D data to entities within a graph data structure to facilitate bidirectional control of data. For example, a user viewing a model of a building may select an element in the model to retrieve attribute information stored in a graph data structure representing the building. As another example, a user viewing a graph data structure of a building may select one of the entities in the graph data structure to retrieve a visual representation of the entity (e.g., a 3D model, etc.). As yet another example, a user viewing a 3D model of a building may wish to know which cameras have a view of a particular doorway and may select the doorway to retrieve information from a graph data structure storing a cameras and their associated views in order to retrieve links to camera feeds associated with cameras that have a view of the doorway.

Model analysis circuit 332 may analyze one or more models to generate information and/or actions. For example, model analysis circuit 332 may analyze a digital representation of a space to generate information such as predicted maintenance for assets within the space. In various embodiments, model analysis circuit 332 may analyze the relationships between points (e.g., data entities, etc.) to determine if behavior of one or more entities (e.g., a HVAC unit, etc.) is anomalous. For example, model analysis circuit 332 may perform pattern matching, performance modeling, and/or the like. In some embodiments, model analysis circuit 332 configures one or more other systems based on one or more models. For example, model analysis circuit 332 may generate fault detection and diagnostic (FDD) thresholds for a FDD system based on a digital twin of a space. In some embodiments, model analysis circuit 332 compares between models to generate information. For example, model analysis circuit 332 may compare a first digital twin associated with a first point in time to a second digital twin associated with a second point in time to identify changes and/or update configurations between models.

Entity graph database 312 may store one or more digital representations of spaces, people, and/or assets. In some embodiments, entity graph database 312 stores a digital representation of a building such as a digital twin. In various embodiments, entity graph database 312 includes one or more graph data structures such as entity graph 170. In various embodiments, smart configuration and commissioning system 300 updates entity graph database 312 to include information from building management system 102, cloud building management platform 140, external systems 350, user devices 360, deployed devices 370, and/or the like. In various embodiments, the one or more digital representations of spaces, people, and/or assets may represent the past and present states of the spaces, people, and/or assets and may be used to predict future states of the spaces, people, and/or assets. For example, each graph data structure (e.g., digital representation, etc.) may be serialized such that comparisons between versions of a digital twin may reveal how an entity associated with the digital twin changed over time. In some embodiments, changes in serialized versions of a graph data structure (or usage thereof) may trigger one or more actions. For example, if a new set of sensors is added to a data structure representing a room then smart configuration and commissioning system 300 may trigger a review of data associated with the room to determine things like if the room was split in two (e.g., during a renovation, etc.), and/or to determine whether a control scheme associated with the room needs to be updated. As an additional example, smart configuration and commissioning system 300 may determine that an occupancy sensor is no longer activated in a room and may trigger a review to determine if a change such as a sensor error or the room being converted into a storage closet are to blame. In some embodiments, actions are triggered across models. For example, if a new space is added to a security system then smart configuration and commissioning system 300 may review a lighting system to see if the change is reflected in the lighting system. As an additional example, if a space is added to a lighting controls system then smart configuration and commissioning system 300 may analyze an access control system to determine if the access policies for doors associated with the space can be inherited from the lighting controls system. In some embodiments, serialized digital twins are stored as a csv file, however one of skill in the art will appreciate that any suitable format may be used (e.g., RDF TTL, etc.). In various embodiments, data structures in entity graph database 312 represent parent/child relationships. Additionally or alternatively, entity graph database 312 may include information such as a space type, space dimensions, geocoordinates (e.g., associated with an entity such as a person or asset, etc.), a location of a nearest exit, locations of amenities (e.g., restrooms, kitchens, etc.), a link to a photograph of the space, a link to a floorplan file, and/or the like.

Entity graph database 312 may include one or more storage mediums. The storage mediums may include but are not limited to magnetic storage, optical storage, flash storage, and/or RAM. Entity graph database 312 may implement or facilitate various APIs to perform database functions (i.e., managing data stored in entity graph database 312). The APIs can be but are not limited to SQL, ODBC, JDBC, and/or any other data storage and manipulation API.

Storage 314 may store information associated with the operation of smart configuration and commissioning system 300. For example, storage 314 may store one or more machine learning models configured to analyze building data and generate predicted future states of operation. One of skill in the art will understand that storage 314 may suitable store many types of data and that, for the sake of brevity, all such types of data are not enumerated herein. Storage 314 may include one or more storage mediums. The storage mediums may include but are not limited to magnetic storage, optical storage, flash storage, and/or RAM. Storage 314 may implement or facilitate various APIs to perform database functions (i.e., managing data stored in storage 314). The APIs can be but are not limited to SQL, ODBC, JDBC, and/or any other data storage and manipulation API.

Figure 4:
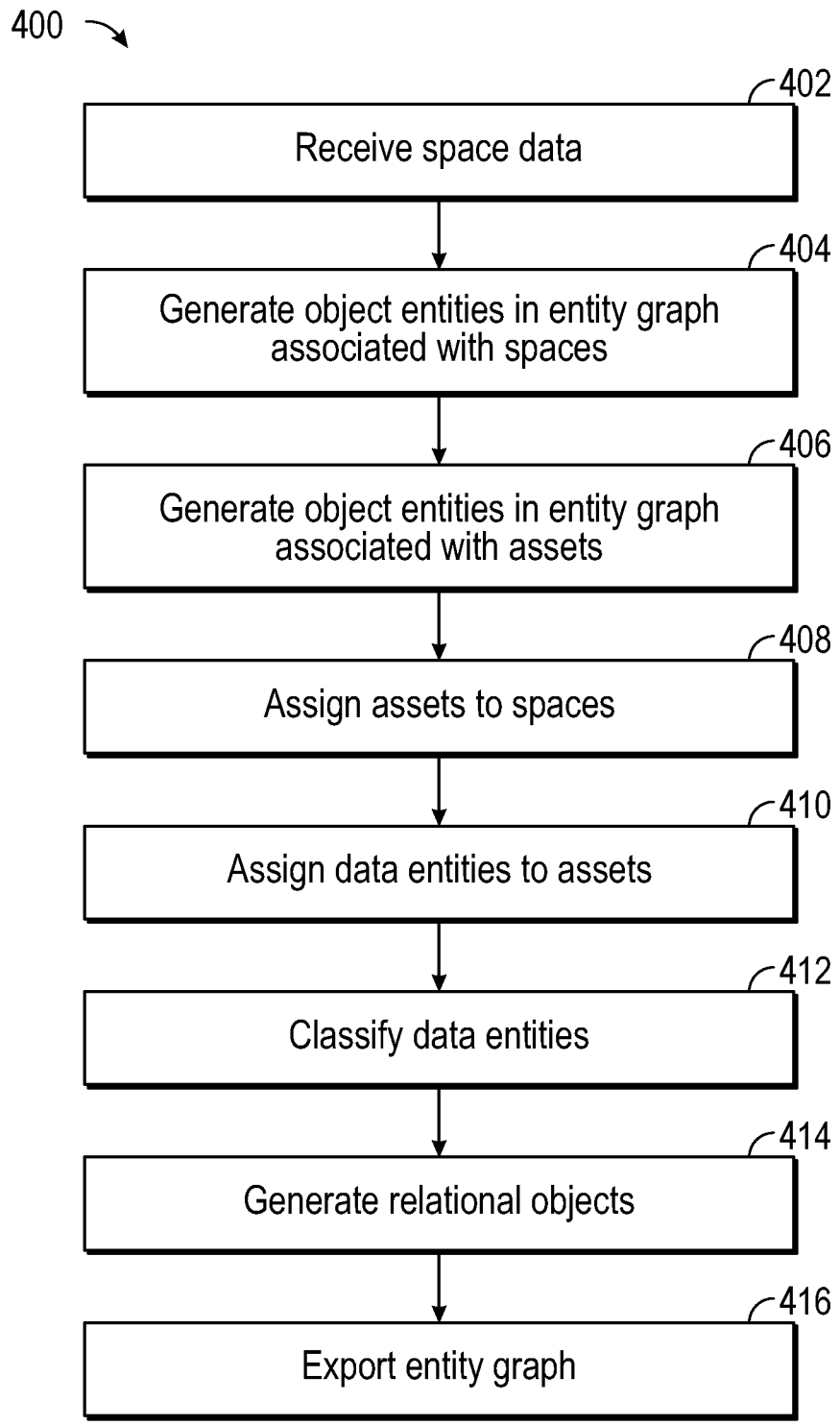
FIG. 4 is a flow diagram illustrating a method of generating an entity graph, according to some exemplary embodiments.

Referring now to FIG. 4, method 400 is shown for generating an entity graph, according to an exemplary embodiment. In various embodiments, smart configuration and commissioning system 300 performs method 400. For example, smart configuration and commissioning system 300 may receive information associated with a building being converted to use a building management system that utilizes a digital representation of the building and may generate a digital representation of the building (e.g., entity graph 170, etc.). At step 402, smart configuration and commissioning system 300 may receive space data. Space data may include data describing a layout of a space. In some embodiments, the space data includes hierarchies. For example, the space data may describe a building having floors which have rooms, etc. The space data may take many forms. For example, the space data may include a space graph (e.g., a graph data structure describing a space, etc.), a BIM, a floorplan, a list of spaces (e.g., for a custom dictionary, etc.), a user description, and/or the like. Additionally or alternatively, the space data may include data generated based on a scan of the building. For example, a building management system may perform a discovery operation (e.g., a scan, etc.) to discover connected devices within a building and may pass the discovered information to smart configuration and commissioning system 300. Additionally or alternatively, smart configuration and commissioning system 300 may receive other data (e.g., asset data, HR data, etc.). For example, in some embodiments, the space data may include a points list indicating data points associated with spaces.

At step 404, smart configuration and commissioning system 300 may generate object entities in an entity graph associated with spaces. Object entities associated with spaces can also be referred to as digital twins of the spaces, or space digital twins. For example, smart configuration and commissioning system 300 may generate object entities for each space included in the space data. For example, smart configuration and commissioning system 300 may generate a node corresponding to a building and a node corresponding to floor within the building and a node corresponding to a room within the floor. In various embodiments, smart configuration and commissioning system 300 may generate spatial relationships and/or classify spaces. For example, smart configuration and commissioning system 300 may generate an edge between a node representing a building and a node representing a floor within the building, wherein the edge represents a relationship between the building and the floor (e.g., building [hasFloor] floor, etc.).

At step 406, smart configuration and commissioning system 300 may generate object entities in an entity graph associated with assets. For example, smart configuration and commissioning system 300 may generate object entities for each asset included in a building. Object entities associated with assets may also be referred to as digital twins of the assets, or asset digital twins. For example, smart configuration and commissioning system 300 may generate a node corresponding to a HVAC system and a node corresponding to a fan within the HVAC system. In various embodiments, smart configuration and commissioning system 300 may generate asset relationships and/or classify assets (e.g., asset types, etc.). For example, smart configuration and commissioning system 300 may generate an edge between a node representing a HVAC system and a node representing a fan within the HVAC system, wherein the edge represents a relationship between the HVAC system and the fan (e.g., HVAC system [hasComponent] fan, etc.). Assets may include people, devices, furniture, lights, objects, supplies, equipment (e.g., HVAC equipment, etc.), decorations, and/or the like. Smart configuration and commissioning system 300 may receive asset information from an EAM system, a COBie file, a list of assets (e.g., for a custom dictionary, etc.), and/or the like. In some embodiments, the asset entities may be generated using data from a points list, such as data that may not necessarily be explicitly tied to an asset but may be indicative of the presence of an asset in a space. In various embodiments, smart configuration and commissioning system 300 may generate an asset graph (e.g., a graph data structure representing assets, etc.).

At step 408, smart configuration and commissioning system 300 may assign assets to spaces. For example, smart configuration and commissioning system 300 may generate relationships between object entities representing spaces and object entities representing assets. For example, smart configuration and commissioning system 300 may generate an edge between a node representing a HVAC system and a node representing a building, wherein the edge represents a relationship between the HVAC system and the building (e.g., HVAC system [servesSpace] building, etc.). In various embodiments, the relationships are bidirectional relationships. For example, an edge may represent a first relationship (e.g., FAN_1 [isControlledBy] CONTROLLER_2, etc.) and a second relationship (e.g., CONTROLLER_2 [Controls] FAN_1, etc.). In some implementations, the bidirectional relationships may not necessarily be direct counterparts or reciprocal relationships; for example, an edge between a thermostat entity and a room entity may indicate that the thermostat is in the room, and another edge may indicate that the room temperature is controlled by the thermostat. In some embodiments, smart configuration and commissioning system 300 assigns assets to spaces using relationships from received data (e.g., existing relationships, etc.). For example, smart configuration and commissioning system 300 may determine relationships between assets and spaces using information from an existing graph data structure (e.g., from a COBie file, from a EAM system, etc.), from a manual site survey, a list of assigned assets (e.g., for a custom dictionary, etc.), by processing strings to extract semantic information (e.g., as described above, etc.), via data manipulation (e.g., matching and/or clustering data, etc.), and/or the like.

At step 410, smart configuration and commissioning system 300 may assign data entities, or points, to assets. For example, smart configuration and commissioning system 300 may generate a data entity representing a point, or measurement value, and link (e.g., via an edge, etc.) the data entity to an asset (e.g., a node, etc.). In various embodiments, data entities include point values (e.g., sensor measurements, etc.). In various embodiments, smart configuration and commissioning system 300 may determine relationships between point values and assets. For example, smart configuration and commissioning system 300 may receive BMS configuration files and use the configuration files to link point values to assets (e.g., TEMP_SENSOR_1 has measurement "70_deg_F" at "14:20:02" on "10/2/2020," etc.). Step 410 may include generating data entities (e.g., generating data entities from received sensor information, etc.). In some embodiments, smart configuration and commissioning system 300 assigns data entities to assets using relationships from received data (e.g., existing relationships, etc.). For example, smart configuration and commissioning system 300 may determine relationships between data entities and assets using information from an external point schedule, a site survey, by processing strings to extract semantic information (e.g., as described above, etc.), and/or the like. In various embodiments, step 410 includes assigning asset-less data entities to spaces. For example, smart configuration and commissioning system 300 may receive a list of sensor readings some of which are not associated with specific sensors and may assign the sensor readings that are not associated with specific sensors to a space (e.g., the space from which the sensors readings originated, etc.). In some embodiments, the points/measured values may be ingested into the entities for the assets/spaces themselves, as opposed to being represented as separate entities/nodes in the graph.

At step 412, smart configuration and commissioning system 300 may classify data entities. For example, smart configuration and commissioning system 300 may generate a relational object (e.g., an edge, etc.) between the data entity and a class entity. For example, smart configuration and commissioning system 300 may generate an edge representing that a sensor reading such as "70_deg_F" is of type TEMP. In some embodiments, smart configuration and commissioning system 300 classifies data entities using relationships from received data (e.g., existing classifications, etc.). For example, smart configuration and commissioning system 300 may classify data entities using information from built-in tags (e.g., of received data, etc.), a standard naming scheme, an existing schedule, "typical" naming (e.g., industry standards, etc.), historical databases (e.g., using an AI classifier, etc.), and/or the like. In some embodiments, step 412 is performed at least partially manually.

At step 414, smart configuration and commissioning system 300 may generate relational objects. For example, smart configuration and commissioning system 300 may generate edges in a graph data structure (e.g., entity graph 170, etc.) that represent relationships between nodes in the graph data structure. The relationships may include relationships between points (e.g., data entities, etc.), assets (e.g., object entities, etc.), and spaces (e.g., object entities, etc.). For example, the relationships may include an edge representing that a AHU serves a room (e.g., AHU_1 [servesSpace] ROOM_20S, etc.), an edge representing that a chiller feeds a bathroom (e.g., CHILLER_20 [Feeds] BATHROOM_20LL, etc.), an edge representing that an occupancy sensor measures the occupancy of a room (e.g., SENSOR_S98 [Measures] ROOM_22S, etc.). In some embodiments, smart configuration and commissioning system 300 relational objects from received data (e.g., existing relationships, etc.). For example, smart configuration and commissioning system 300 may generate relationships using information from built-in "slots" within tags (e.g., of received data, etc.), a standard naming scheme, an existing schedule, "typical" naming (e.g., industry standards, etc.), historical databases (e.g., using an AI classifier, etc.), and/or the like. In some embodiments, step 414 is performed at least partially manually. At step 416, smart configuration and commissioning system 300 may export an entity graph. For example, smart configuration and commissioning system 300 may export an entity graph constructed during method 400 for use by other systems (e.g., a BMS, etc.).

Figure 5:
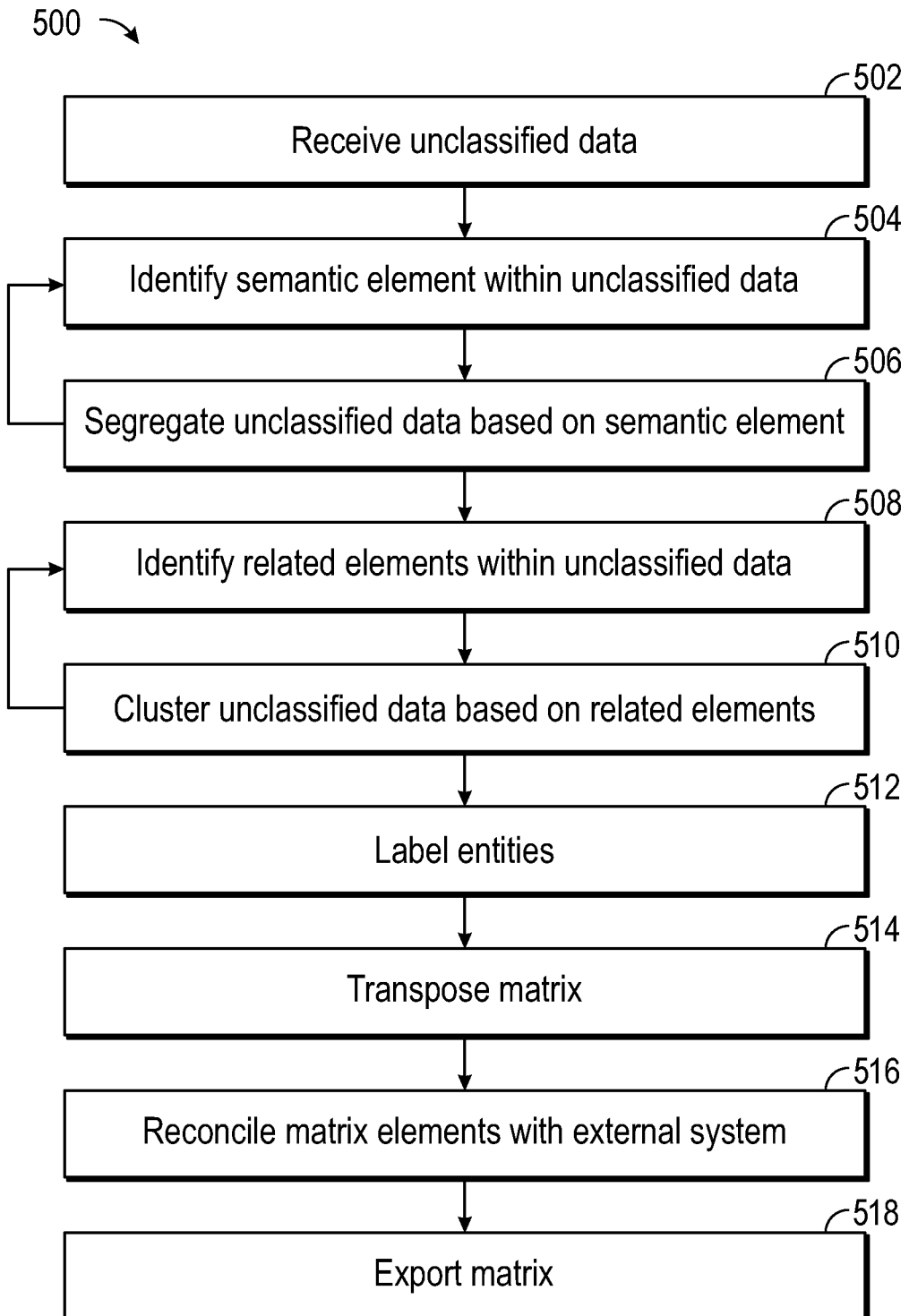
FIG. 5 is a flow diagram illustrating a method of classifying input strings, according to some exemplary embodiments.

Referring now to FIG. 5, method 500 for classifying input strings is shown, according to an exemplary embodiment. In various embodiments, smart configuration and commissioning system 300 performs method 500. For example, smart configuration and commissioning system 300 may classify input strings using statistical analysis and/or machine learning as described above with reference to FIG. 3. In various embodiments, method 500 include the use of one or more APIs and/or SDKs to facilitate ingesting data from external sources. For example, a technician may use an API to ingest data and extract semantic information from an existing BMS into a digital representation associated with a newly installed system. In some embodiments, method 500 is performed automatically (e.g., with little to no user intervention, etc.). Additionally or alternatively, method 500 may be performed at least partially manually by a user (e.g., during a setup phase of a system installation, etc.). At step 502, smart configuration and commissioning system 300 may receive unclassified data. Unclassified data may include raw metadata, strings, and/or the like. For example, smart configuration and commissioning system 300 may receive strings from BMS configuration files (e.g., of a BMS system that is being upgraded, etc.) that are associated with a scan (e.g., a BACnet point scan, etc.) to discover connected devices within a building. In various embodiments, the unclassified data includes semantic information to be extracted.

At step 504, smart configuration and commissioning system 300 may identify semantic elements within the unclassified data. For example, step 504 may include parsing a string using a separator (e.g., separating "ZONE.AHU01.RM2008S.ZONE_AIR_TEMP" into "ZONE," "AHU01," "RM2008S," "ZONE_AIR_TEMP," etc.). In various embodiments, the semantic elements include object entities, data entities, and/or relationships between various entities. For example, smart configuration and commissioning system 300 may extract the relationship FLOOR_2 [hasLocation] BUILDING_1 from a string. In some embodiments, step 504 includes executing one or more machine learning models. For example, step 504 may include executing a LSTM model with character embedding to extract semantic information from strings. In some embodiments, step 504 includes surfacing proposed semantic elements (e.g., generated based on ML analysis, etc.) to a user for selection. In some embodiments, method 500 includes feeding a ML and/or AI model one or more examples of user-classifications (e.g., a string a user has manually classified, etc.) to train the ML and/or AI model and facilitate automated extraction of the rest of the strings.

At step 506, smart configuration and commissioning system 300 may segregate unclassified data based on the semantic elements. For example, smart configuration and commissioning system 300 may generate a multi-dimensional matrix having columns associated with the identified semantic elements from a 1-dimensional list of strings. In some embodiments, steps 504 and 506 repeat until a number (e.g., a threshold amount, etc.) of possible semantic elements have been extracted.

At step 508, smart configuration and commissioning system 300 may identify related elements within unclassified data. For example, smart configuration and commissioning system 300 may identify a number of sensors that are all of type TEMP_SENSOR. As another example, smart configuration and commissioning system 300 may identify a number of rooms that are on a specific floor of a building. In various embodiments, step 508 includes executing one or more machine learning models. For example, step 506 may include using a machine learning classifier to identify related elements within the data. Additionally or alternatively, one or more algorithms may be used to identify related elements. For example, an n-gram algorithm may be used to identify related elements.

At step 510, smart configuration and commissioning system 300 may cluster unclassified data based on related elements. For example, smart configuration and commissioning system 300 may cluster specific rows of a multi-dimensional matrix associated with elements that are related. In some embodiments, step 510 includes assigning one or more elements to a group. For example, a number of AHUs that serve a floor within a building may be tagged as serving the floor. In some embodiments, steps 1109 and 510 repeat until a number (e.g., a threshold amount, etc.) of possible related elements have been clustered.

At step 512, smart configuration and commissioning system 300 may label entities. For example, smart configuration and commissioning system 300 may label entities in a matrix as data entities, object entities, class entities, and/or the like. In various embodiments, smart configuration and commissioning system 300 may generate labeled entities (e.g., for an entity graph, etc.) based on the information surfaced in previous steps. For example, smart configuration and commissioning system 300 may label a row as being associated with a temperature sensor. In various embodiments, data in the matrix is grouped by entity. For example, entries in a first column of a matrix may be associated with unique entities (e.g., people, places, and/or assets, etc.).

At step 514, smart configuration and commissioning system 300 may transpose the matrix. In various embodiments, step 514 is optional. For example, step 514 may facilitate converting a matrix representing attributes associated with a number of entities into a matrix representing timeseries values generated by a number of entities. At step 516, smart configuration and commissioning system 300 may reconcile the matrix elements with an external system. In various embodiments, the external system is a server configured to receive data and perform one or more operations on the data. Additionally or alternatively, the external server may be part of smart configuration and commissioning system 300. For example, step 516 may include sending location information associated with one or more entities to a server to determine whether the location information is associated with a first location or a second location (e.g., whether "Madison" refers to Madison, WI or Madison, AL, etc.). In various embodiments, reconciling the matrix may include computing one or more functions using the matrix information. For example, smart configuration and commissioning system 300 may enrich the matrix information by reconciling the matrix to derive distance measurements associated with the distance between each entity within the matrix (e.g., the distance between a first building and a second building, etc.). At step 518, smart configuration and commissioning system 300 may export the matrix. In various embodiments, the matrix may be used by other systems to determine information and/or actions. For example, data ingestion circuit 320 may use the matrix to generate a digital representation of a space and/or model integration circuit 328 may use the matrix to integrate existing data (e.g., extracted from unclassified strings provided by a legacy BMS, etc.) into a digital representation.

Figure 6B:
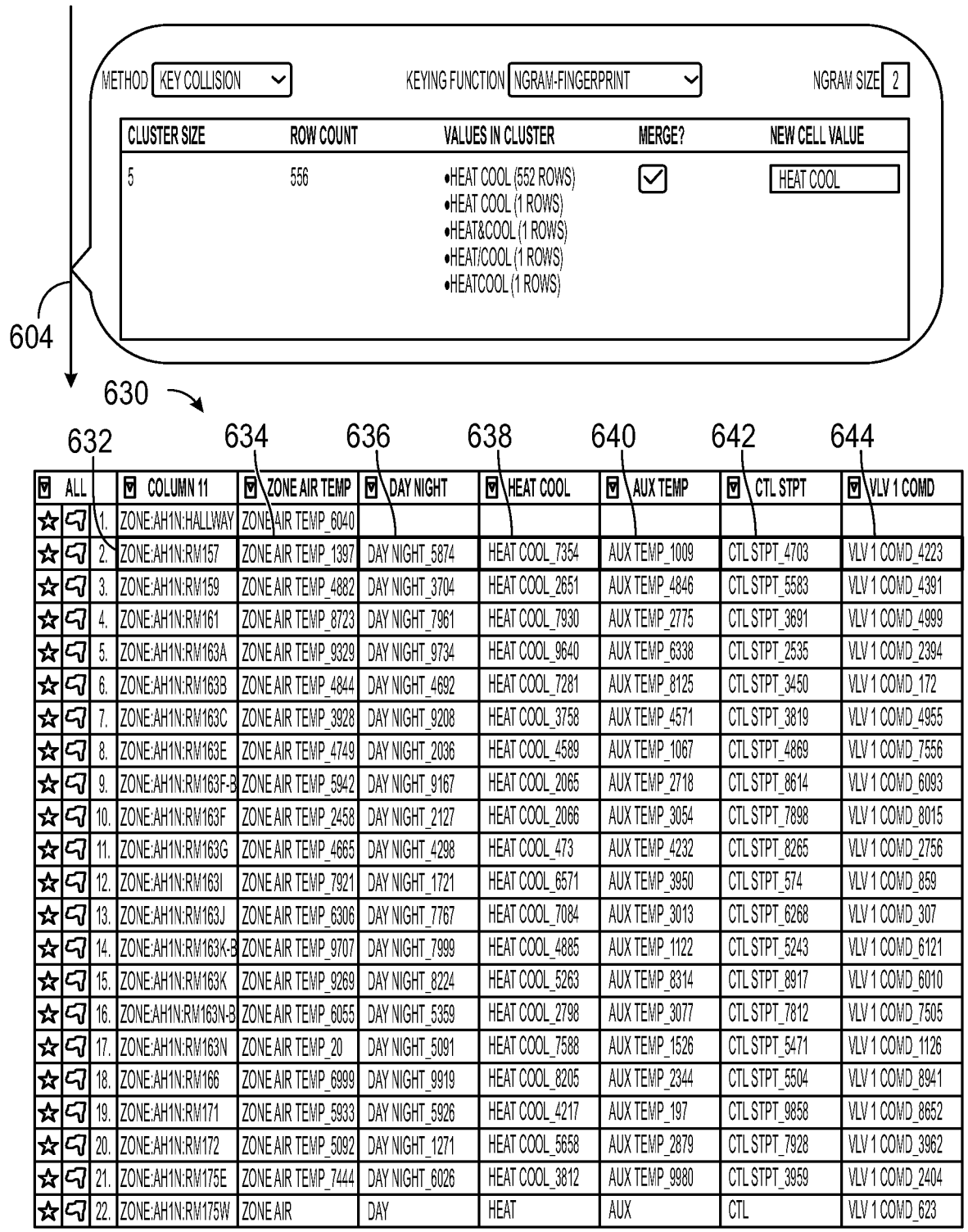

Referring now to FIGS. 6A-B, diagram 600 illustrating input string manipulation is shown, according to an exemplary embodiment. In various embodiments, smart configuration and commissioning system 300 implements input string manipulation as shown in diagram 600. In various embodiments, diagram 600 illustrates input string manipulation as described in detail above with reference to FIG. 5. Diagram 600 starts with input list 610. Input list 610 may include a number of unclassified strings. For example, input list 610 may include a number of strings from a BMS configuration file. As another example, input list 610 may include a number of strings from a BACnet point scan (e.g., a BMS discovery scan, etc.). Input list 610 may include one or more input strings 612. Input strings 612 may be associated with an entity (e.g., people, places, and/or assets, etc.) within a space such as a building. Additionally or alternatively, input strings 612 may be associated with data (e.g., a data entity, a point value, etc.). In various embodiments, input strings 612 include semantic information (e.g., information describing a space and/or entities within a space, etc.).

At step 602, smart configuration and commissioning system 300 may segregate input list 610 based on semantic elements to generate matrix 620. For example, smart configuration and commissioning system 300 may generate one or more columns based on input list 610. Matrix 620 may include elements 622-628. One of skill in the art will appreciate that matrix 620 may include any number of elements (e.g., five elements, a thousand elements, etc.). Each of elements 622-628 may be associated with different information. For example, a first element 622 may be associated with a space type (e.g., ZONE, etc.), a second element 624 may be associated with a device identifier (e.g., AH1N, etc.), a third element 626 may be associated with a room identifier (e.g., RM159, etc.), and a fourth element 628 may be associated with a data type (e.g., Day/Night, etc.).

At step 604, smart configuration and commissioning system 300 may cluster data based on related elements. For example, smart configuration and commissioning system 300 may cluster matrix 620 based on similar values (e.g., "heat cool" vs. "heat coool," etc.). In various embodiments, step 604 may facilitate correcting errors (e.g., user input errors, etc.). In some embodiments, step 604 includes performing one or more matrix operations on matrix 620. For example, smart configuration and commissioning system 300 may transpose matrix 620 to generate transposed matrix 630. Transposed matrix 630 may include a number of parameters 634-644 associated with a specific entity (e.g., entity 632, "ZONE:AH1N:RM157," etc.). Parameters 634-644 may include one or more variable values and/or pointers to one or more variable values. For example, parameters 634-644 may include a zone air temperature (e.g., Zone Air Temp_1397, etc.), a day/night parameter (e.g., Day Night_5874, etc.), a heat/cool parameter (e.g., Heat Cool_7354, etc.), an auxiliary temperature (e.g., AUX TEMP_1009, etc.), a control setpoint (e.g., CTL STPT_4703, etc.), a valve command (e.g., VLV 1 COMD_4223, etc.), and/or the like. In various embodiments, transposed matrix 630 may be used by smart configuration and commissioning system 300 to setup and/or modify a digital representation of a space such as a graph data structure.

Figure 7:
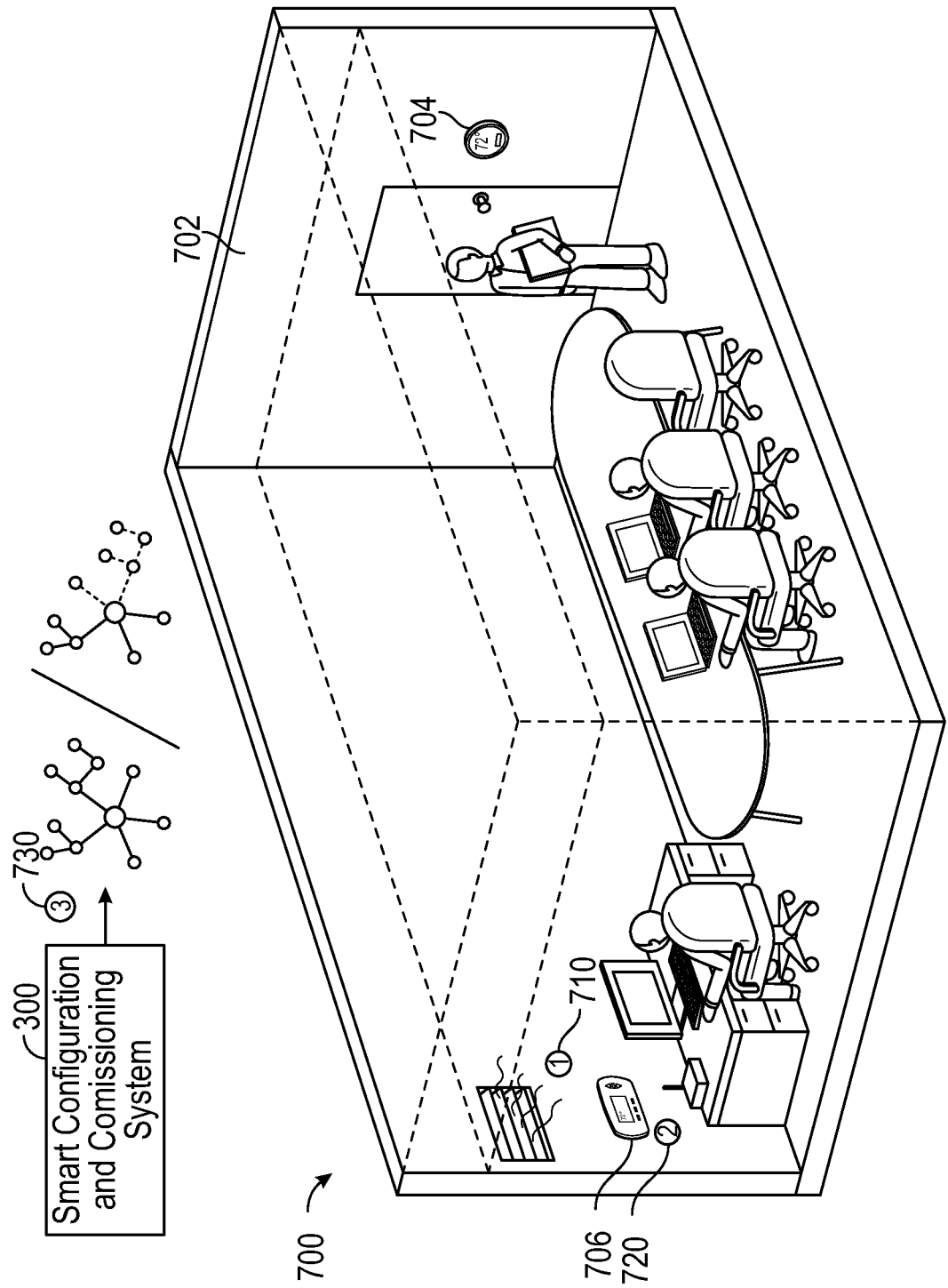
FIG. 7 is diagram illustrating auto-commissioning a space, according to some exemplary embodiments.

Referring now to FIG. 7, system 700 for auto-commissioning of a space, shown as room 702, is shown, according to an exemplary embodiment. In various embodiments, smart configuration and commissioning system 300 auto-commissions room 702. For example, smart configuration and commissioning system 300 may analyze a graph data structure representing room 702, identify information in the graph data structure that needs completing/updating, and perform one or more operations to derive information to at least partially complete and/or update the graph data structure. As a general example, smart configuration and commissioning system 300 may receive an entity graph (e.g., entity graph 170, etc.) with a number of unlabeled sensors (e.g., sensors not associated with a specific space, etc.) and may operate one or more HVAC systems within a building while measuring operation of the number of unlabeled sensors to determine a location within the building that each of the number of unlabeled sensors is associated with. Room 702 is shown to include thermostat 704 and temperature sensor 706. In some embodiments, room 702 includes one or more users. In some embodiments, the one or more users having devices (e.g., mobile devices, etc.) that may be used to provide feedback to smart configuration and commissioning system 300.

At step 710, smart configuration and commissioning system 300 may modify an operation of room 702 and/or one or more entities (e.g., building assets, etc.) associated with room 702. For example, smart configuration and commissioning system 300 may modify operation of an HVAC system serving room 702, may modify operation of one or more smart lights located in room 702, and/or the like. In various embodiments, step 710 modifies one or more environmental parameters associated with room 702. For example, step 710 may modify a temperature of room 702, a lighting in room 702, a sound level in room 702, an asset within room 702 (e.g., turning on/off a television, etc.), and/or the like.

At step 720, smart configuration and commissioning system 300 may measure an effect of step 710. Additionally or alternatively, smart configuration and commissioning system 300 may receive measurements from another system (e.g., building management system 102, etc.). Step 720 may include receiving sensor information from one or more sensors. For example, step 720 may include receiving a temperature measurement from at least one of thermostat 704 and/or temperature sensor 706.

At step 730, smart configuration and commissioning system 300 may modify a graph data structure such as entity graph 170. For example, smart configuration and commissioning system 300 may modify entity graph 170 to generate an edge connecting a node representing thermostat 704 to a node representing room 702, wherein the edge represents that thermostat 704 is located within room 702. In various embodiments, step 730 includes analyzing received data to determine relationships between various entities. For example, smart configuration and commissioning system 300 may determine that thermostat 704 is located in room 702 because thermostat 704 measured a temperature increase corresponding to what would be expected based on operation of a HVAC system during step 710. In some embodiments, step 730 includes generating data to fill in gaps in an existing graph data structure (e.g., a digital representation of room 702, etc.). For example, smart configuration and commissioning system 300 may generate relationship data describing a location of a sensor for an existing sensor that is missing a location. In various embodiments, step 730 includes analyzing data from various sources. For example, step 730 may include analyzing user feedback from one or more users located in a room. For example, smart configuration and commissioning system 300 may operate a HVAC system that is not linked to which rooms it serves and may receive user feedback indicating that a specific room suddenly changed temperature (or became uncomfortable, etc.) and may determine that the HVAC system serves the specific room. As another example, smart configuration and commissioning system 300 may turn on/off a television that has not been associated with a specific space in a digital representation of a building and may receive user feedback that a television in a specific room turned on/off and may determine that the television is located in the specific room. In various embodiments, step 730 includes generating one or more nodes and/or one or more edges.

Additionally or alternatively, step 730 may include generating one or more health metrics. For example, smart configuration and commissioning system 300 may generate a health metric associated with thermostat 704 that indicates that data from thermostat 704 may not be valid. As a brief example, smart configuration and commissioning system 300 may determine that thermostat 704 is supposedly located in room 702, however upon changing a temperature of room 702, smart configuration and commissioning system 300 may only observe a change in temperature measurements from temperature sensor 706 (e.g., and/or one or more other temperature sensors, etc.) and may determine that thermostat 704 may be malfunctioning (e.g., not producing reliable data) and may generate a health metric associated with thermostat 704. Additionally or alternatively, smart configuration and commissioning system 300 may determine that thermostat 704 is in fact not located in room 702 (e.g., which would explain why thermostat 704 did not register a change in temperature, etc.). In various embodiments, health metrics may be used to reduce nuisance alarms and/or prevent alarm fatigue. For example, building management system 102 may suppress alarms associated with data having a health metric that indicates that the data may be unreliable.

Figure 8:
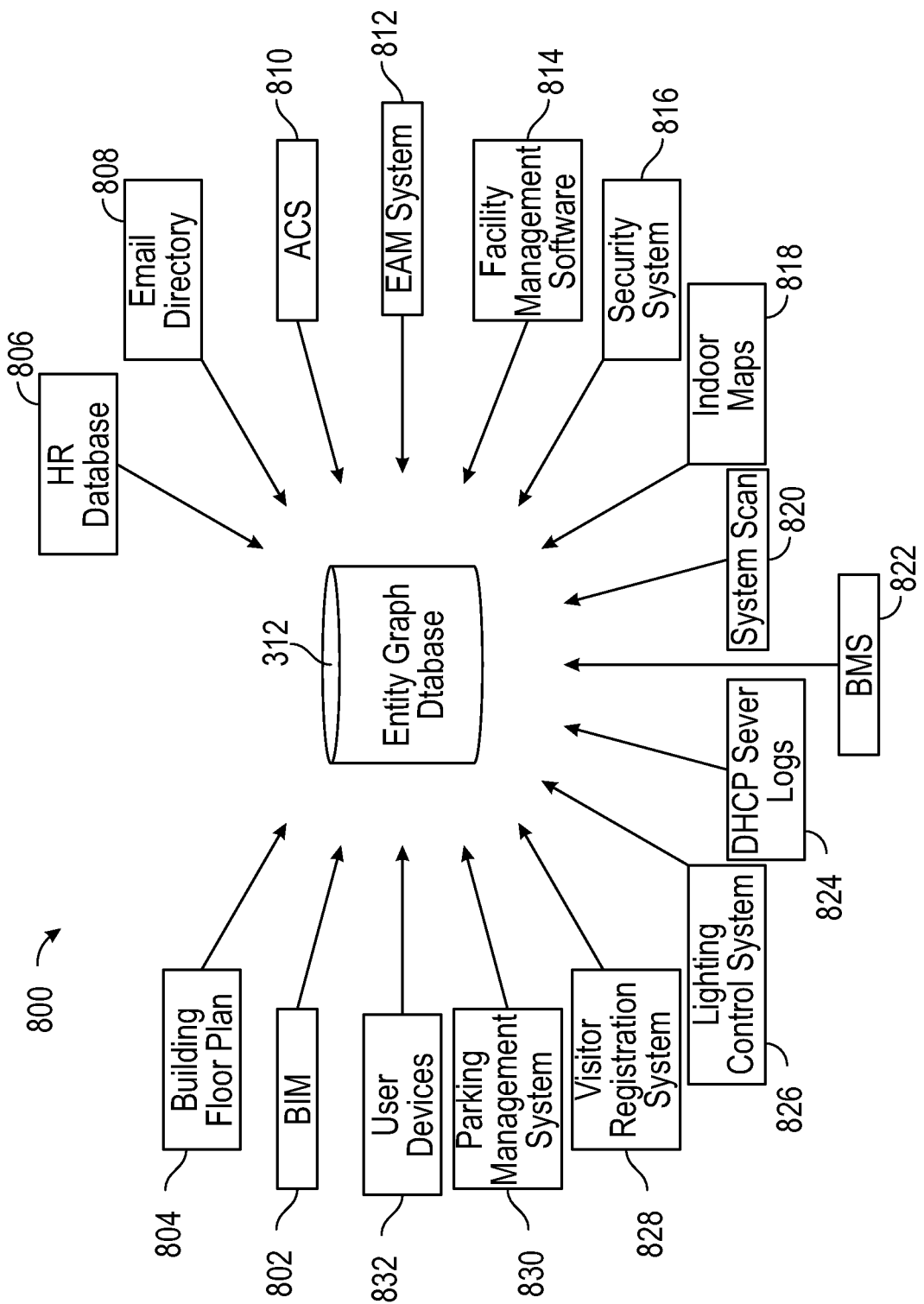
FIG. 8 is a diagram illustrating digesting information into an entity graph, according to some exemplary embodiments.

Referring now to FIG. 8, system 800 for digesting information into an entity graph is shown, according to an exemplary embodiment. In various embodiments, smart configuration and commissioning system 300 digests information into a graph data structure such as entity graph 170. In various embodiments, smart configuration and commissioning system 300 may generate a digital representation of a space based on ingested data. System 800 is shown to include entity graph database 312. In various embodiments, entity graph database 312 includes one or more graph data structures. Smart configuration and commissioning system 300 may receive data from one or more sources and integrate the received data into one or more graph data structures of entity graph database 312. In various embodiments, by combining a number of data sources smart configuration and commissioning system 300 may generate a more complete and detailed representation of an entity. In various embodiments, digesting information into an entity graph may include eliminating duplicates between and/or within datasets. For example, a first HR database may include a first individual and a second visitor registration system may include the first individual and smart configuration and commissioning system 300 may deduplicate the first individual to create a single data representation for the first individual.

In various embodiments, sources 802-832 are integrated (e.g., by smart configuration and commissioning system 300, data ingestion circuit 320, data preprocessing circuit 322, semantic extraction circuit 324, model integration circuit 328, etc.) into entity graph database 312. For example, smart configuration and commissioning system 300 may integrate information from BIM 802 (e.g., IFC files, Revit files, RDF graph models, TTL data, etc.), building floorplan 804 (e.g., SVG images, etc.), HR database 806, email directory 808, ACS 810, EAM system 812 (e.g., COBie files, excel documents, csv files, etc.), facility management systems/software 814, security system 816, indoor maps 818, system scan 820 (e.g., a BACnet scan, etc.), BMS 822, DHCP server logs 824, lighting control system 826, visitor registration system 828, parking management system 830, user device 832, and/or the like.

Figure 9:
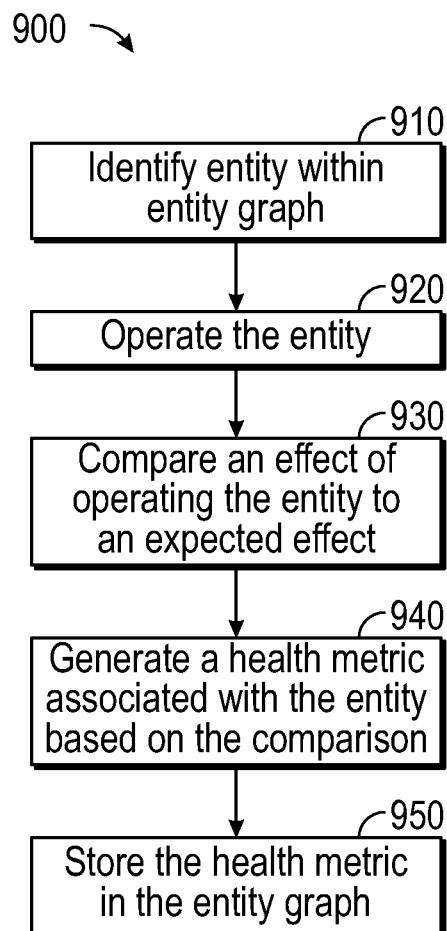
FIG. 9 is a diagram illustrating augmenting an entity graph with additional information, according to some exemplary embodiments.

Referring now to FIG. 9, method 900 of augmenting an entity graph with additional information is shown, according to an exemplary embodiment. In various embodiments, smart configuration and commissioning system 300 performs method 900. For example, smart configuration and commissioning system 300 may perform method 900 to generate additional information for a graph data structure that may facilitate operation of a space such as a building. In various embodiments, the additional information includes a health metric. The health metric may be associated with an accuracy of data. For example, a health metric associated with a relationship between two entities may indicate the likelihood that the relationship is true. As another example, a health metric associated with a sensor reading may indicate the likelihood that the sensor reading is accurate (e.g., describes a true value associated with a measured parameter, etc.).

At step 910, smart configuration and commissioning system 300 may identify one or more entities within an entity graph. For example, smart configuration and commissioning system 300 may identify a node within a graph data structure corresponding to an asset within a building. At step 920, smart configuration and commissioning system 300 may operate the identified entity 920. Additionally or alternatively, step 920 may include operating one or more entities associated with the identified entity. For example, the identified entity may include a room and step 920 may include operating a HVAC system that serves the room (or is thought to serve the room, etc.).

At step 930, smart configuration and commissioning system 300 may compare an effect of operating the entity to an expected effect. For example, smart configuration and commissioning system 300 may expect that operating a HVAC system associated with the room would result in measuring an increased temperature in the room, however smart configuration and commissioning system 300 may observe that no such change occurs. In various embodiments, step 930 includes receiving measurements from one or more entities (e.g., assets, devices, users, etc.). For example, smart configuration and commissioning system 300 may measure the effect of operating an entity (e.g., step 920, etc.).

At step 940, smart configuration and commissioning system 300 may generate a health metric associated with the entity based on the comparison. For example, smart configuration and commissioning system 300 may generate a metric that describes the reliability of sensor data. As another example, smart configuration and commissioning system 300 may generate a metric that describes the likelihood that an edge representing a relationship between two nodes is accurate. In various embodiments, smart configuration and commissioning system 300 may generate a health metric associated with a high degree of accuracy/confidence based on observing an effect of operating the entity consistent with an expected effect. Similarly, smart configuration and commissioning system 300 may generate a health metric associated with a low degree of accuracy/confidence based on observing an effect of operating the entity that deviates (e.g., by some threshold, etc.) from an expected effect. For example, a room may include a number of temperature sensors and in response to operating an HVAC system serving the room all of the number of temperature sensors in the room except for one may indicate a change in temperature. To continue the example, smart configuration and commissioning system 300 may determine that the one temperature sensor is faulty (e.g., producing unreliable temperature readings, etc.) and/or the one temperature sensor is not actually located in the room (e.g., a digital representation of the temperature sensor has been incorrectly mapped to the room, etc.). Based on the determination, smart configuration and commissioning system 300 may perform one or more actions such as saving a health metric associated with point values of the temperature sensor (e.g., the health metric indicating that the point values have a low degree of reliability, etc.), ordering maintenance on the temperature sensor, updating a graph data structure to correctly map the temperature sensor with a new space, and/or the like. At step 950, smart configuration and commission system 300 may store the health metric in the entity graph. For example, smart configuration and commissioning system 300 may generate a new data structure (e.g., a data entity, a node, etc.) associated with point values of the temperature sensor.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

The term "client or "server" include all kinds of apparatus, devices, and machines for processing data, including by way of example a programmable processor, a computer, a system on a chip, or multiple ones, or combinations, of the foregoing. The apparatus may include special purpose logic circuitry, e.g., a field programmable gate array (FPGA) or an application specific integrated circuit (ASIC). The apparatus may also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment may realize various different computing model infrastructures, such as web services, distributed computing and grid computing infrastructures.

The systems and methods of the present disclosure may be completed by any computer program. A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform actions by operating on input data and generating output. The processes and logic flows may also be performed by, and apparatus may also be implemented as, special purpose logic circuitry (e.g., an FPGA or an ASIC).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data (e.g., magnetic, magneto-optical disks, or optical disks). However, a computer need not have such devices. Moreover, a computer may be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive), etc.). Devices suitable for storing computer program instructions and data include all forms of non-volatile memory, media and memory devices, including by way of example semiconductor memory devices (e.g., EPROM, EEPROM, and flash memory devices; magnetic disks, e.g., internal hard disks or removable disks; magneto-optical disks; and CD ROM and DVD-ROM disks). The processor and the memory may be supplemented by, or incorporated in, special purpose logic circuitry.

In various implementations, the steps and operations described herein may be performed on one processor or in a combination of two or more processors. For example, in some implementations, the various operations could be performed in a central server or set of central servers configured to receive data from one or more devices (e.g., edge computing devices/controllers) and perform the operations. In some implementations, the operations may be performed by one or more local controllers or computing devices (e.g., edge devices), such as controllers dedicated to and/or located within a particular building or portion of a building. In some implementations, the operations may be performed by a combination of one or more central or offsite computing devices/servers and one or more local controllers/computing devices. All such implementations are contemplated within the scope of the present disclosure. Further, unless otherwise indicated, when the present disclosure refers to one or more computer-readable storage media and/or one or more controllers, such computer-readable storage media and/or one or more controllers may be implemented as one or more central servers, one or more local controllers or computing devices (e.g., edge devices), any combination thereof, or any other combination of storage media and/or controllers regardless of the location of such devices.

To provide for interaction with a user, implementations of the subject matter described in this specification may be implemented on a computer having a display device (e.g., a CRT (cathode ray tube), LCD (liquid crystal display), OLED (organic light emitting diode), TFT (thin-film transistor), or other flexible configuration, or any other monitor for displaying information to the user and a keyboard, a pointing device, e.g., a mouse, trackball, etc., or a touch screen, touch pad, etc.) by which the user may provide input to the computer. Other kinds of devices may be used to provide for interaction with a user as well; for example, feedback provided to the user may be any form of sensory feedback (e.g., visual feedback, auditory feedback, or tactile feedback), and input from the user may be received in any form, including acoustic, speech, or tactile input. In addition, a computer may interact with a user by sending documents to and receiving documents from a device that is used by the user; for example, by sending web pages to a web browser on a user's client device in response to requests received from the web browser.

Implementations of the subject matter described in this disclosure may be implemented in a computing system that includes a back-end component (e.g., as a data server), or that includes a middleware component (e.g., an application server), or that includes a front end component (e.g., a client computer) having a graphical user interface or a web browser through which a user may interact with an implementation of the subject matter described in this disclosure, or any combination of one or more such back end, middleware, or front end components. The components of the system may be interconnected by any form or medium of digital data communication (e.g., a communication network). Examples of communication networks include a LAN and a WAN, an inter-network (e.g., the Internet), and peer-to-peer networks (e.g., ad hoc peer-to-peer networks).

The present disclosure may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated. Further, features or aspects within each example embodiment should typically be considered as available for other similar features or aspects in other example embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A method for generating a graph data structure, comprising:
   receiving, by one or more processors, data associated with a building;
   generating, by the one or more processors, based on the data, one or more space nodes in the graph data structure, the one or more space nodes corresponding to respective spaces within the building;
   generating, by the one or more processors, based on the data, one or more asset nodes in the graph data structure, the one or more asset nodes corresponding to respective assets within the building;
   generating, by the one or more processors, one or more sensor data nodes based on sensor data and one or more edges in the graph data structure that link the one or more sensor data nodes with respective asset nodes of the one or more asset nodes;
   classifying, by the one or more processors, based on the data, the one or more sensor data nodes at least by:
      (i) executing, by the one or more processors, a neural network trained to extract semantic elements corresponding to the one or more sensor data nodes from the data, the neural network receiving at least one string from the data as input, and
      (ii) determining classifications for the one or more sensor data nodes based on the semantic elements extracted using the neural network, the classifications used to generate relationships in the graph data structure between the one or more sensor data nodes and one or more class entities of the graph data structure corresponding to the classifications of the one or more sensor data nodes; and
   generating, by the one or more processors, using the classifications of the one or more sensor data nodes, a relationship in the graph data structure between the one or more space nodes and the one or more sensor data nodes.

2. The method of claim 1, wherein the data includes building information model (BIM) data.

3. The method of claim 1, wherein generating the one or more space nodes includes extracting an identifier from the data associated with the building and storing the identifier with at least one of the one or more space nodes.

4. The method of claim 1, wherein generating the one or more asset nodes includes extracting an identifier from the data associated with the building and storing the identifier with at least one of the one or more asset nodes.

5. The method of claim 1, wherein generating the one or more edges that link the one or more sensor data nodes with the respective asset nodes of the one or more asset nodes includes dynamically controlling an environmental variable of the building, monitoring sensor measurements, and generating the one or more edges based on the monitoring.

6. The method of claim 1, wherein classifying the one or more sensor data nodes includes assigning a tag to a sensor data node of the one or more sensor data nodes, wherein the tag is associated with at least one of a source of the sensor data represented by the sensor data node or a purpose of the sensor data represented by the sensor data node.

7. The method of claim 1, wherein generating the relationship includes parsing the at least one string to identify a semantic representation associating a space node of the one or more space nodes and a value of the one or more sensor data nodes.

8. The method of claim 1, wherein generating the one or more edges that link the one or more sensor data nodes with the respective asset nodes of the one or more asset nodes is further based on a source of the sensor data.

9. One or more non-transitory computer-readable storage media having instructions stored thereon that, when executed by one or more processors, cause the one or more processors to:
   receive data associated with a building;
   generate, based on the data, one or more space nodes in a graph data structure, the one or more space nodes corresponding to respective spaces within the building;
   generate, based on the data, one or more asset nodes in the graph data structure, the one or more asset nodes corresponding to respective assets within the building;
   generate one or more sensor data nodes based on sensor data;
   classify, based on the data, the one or more sensor data nodes at least by:
      (i) executing a neural network trained to extract semantic elements corresponding to the one or more sensor data nodes from the data, the neural network receiving at least one string from the data as input, and
      (ii) determining classifications for the one or more sensor data nodes based on the semantic elements extracted using the neural network, the classifications used to generate relationships in the graph data structure between the one or more sensor data nodes and one or more class entities of the graph data structure corresponding to the classifications of the one or more sensor data nodes; and
   generate, using the classifications of the one or more sensor data nodes, relationships between the one or more space nodes, the one or more asset nodes, and the one or more sensor data nodes.

10. The one or more non-transitory computer-readable storage media of claim 9, wherein the data includes building information model (BIM) data.

11. The one or more non-transitory computer-readable storage media of claim 9, wherein generating the one or more space nodes includes extracting an identifier from the data associated with the building and storing the identifier with at least one of the one or more space nodes.

12. The one or more non-transitory computer-readable storage media of claim 9, wherein generating the one or more asset nodes includes extracting an identifier from the data associated with the building and storing the identifier with at least one of the one or more asset nodes.

13. The one or more non-transitory computer-readable storage media of claim 9, wherein the instructions further cause the one or more processors to generate one or more edges that link the one or more sensor data nodes with respective asset nodes of the one or more asset nodes based on dynamically controlling an environmental variable of the building, monitoring sensor measurements, and generating the one or more edges based on the monitoring.

14. The one or more non-transitory computer-readable storage media of claim 9, wherein classifying the one or more sensor data nodes includes assigning a tag to a sensor data node of the one or more sensor data nodes, wherein the tag is associated with at least one of a source of the sensor data represented by the sensor data node or a purpose of the sensor data represented by the sensor data node.

15. The one or more non-transitory computer-readable storage media of claim 9, wherein generating the relationships includes parsing the at least one string to identify a semantic representation associating a space node of the one or more space nodes and a value of the one or more sensor data nodes.

16. The one or more non-transitory computer-readable storage media of claim 9, wherein the instructions further cause the one or more processors to generate one or more edges that link the one or more sensor data nodes with respective asset nodes of the one or more asset nodes based on a source of the sensor data.

17. A system for generating a graph data structure comprising a processing circuit including a processor and memory, the memory having instructions stored thereon that, when executed by the processor, cause the processing circuit to:
receive data associated with a building;
generate, based on the data, one or more space nodes in the graph data structure, the one or more space nodes corresponding to respective spaces within the building;
generate, based on the data, one or more asset nodes in the graph data structure, the one or more asset nodes corresponding to respective assets within the building;
generate one or more sensor data nodes based on sensor data and one or more edges in the graph data structure that link the one or more sensor data nodes with respective asset nodes of the one or more asset nodes;
classify, based on the data, the one or more sensor data nodes at least by:
 (i) executing a neural network trained to extract semantic elements corresponding to the one or more sensor data nodes from the data, the neural network receiving at least one string from the data as input, and
 (ii) determining classifications for the one or more sensor data nodes based on the semantic elements extracted using the neural network, the classifications used to generate relationships in the graph data structure between the one or more sensor data nodes and one or more class entities of the graph data structure corresponding to the classifications of the one or more sensor data nodes; and
generate, using the classifications of the one or more sensor data nodes, a relationship between at least two of the one or more space nodes and the one or more sensor data nodes.

18. The system of claim 17, wherein the data includes building information model (BIM) data.

19. The system of claim 17, wherein generating the one or more space nodes includes extracting an identifier from the data associated with the building and storing the identifier with at least one of the one or more space nodes.

20. The system of claim 17, wherein classifying the one or more sensor data nodes includes assigning a tag to a sensor data node of the one or more sensor data nodes, wherein the tag is associated with at least one of a source of the sensor data represented by the sensor data node or a purpose of the sensor data represented by the sensor data node.

* * * * *